United States Patent
Yamazaki et al.

(10) Patent No.: US 9,123,912 B2
(45) Date of Patent: Sep. 1, 2015

(54) LIGHT-EMITTING DEVICE AND MANUFACTURING METHOD THEREOF

(75) Inventors: Shunpei Yamazaki, Tokyo (JP); Nobuharu Ohsawa, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 267 days.

(21) Appl. No.: 13/420,030

(22) Filed: Mar. 14, 2012

(65) Prior Publication Data

US 2012/0235126 A1    Sep. 20, 2012

(30) Foreign Application Priority Data

Mar. 18, 2011  (JP) .................................. 2011-060846

(51) Int. Cl.
| | | |
|---|---|---|
| *H01L 51/56* | (2006.01) | |
| *H01L 51/52* | (2006.01) | |
| *H01L 51/50* | (2006.01) | |

(52) U.S. Cl.
CPC ........ *H01L 51/5265* (2013.01); *H01L 51/5036* (2013.01); *H01L 51/56* (2013.01); *H01L 2251/5315* (2013.01); *H01L 2251/5361* (2013.01); *H01L 2251/558* (2013.01)

(58) Field of Classification Search
CPC ............................ H01L 51/56; H01L 27/3218
USPC ............................ 257/40, 37, 66, 88; 427/554
See application file for complete search history.

(56) References Cited

U.S. PATENT DOCUMENTS

| 7,683,297 | B2 | 3/2010 | Kishi et al. | |
|---|---|---|---|---|
| 2009/0008643 | A1* | 1/2009 | Yamazaki et al. | 257/59 |
| 2009/0133922 | A1* | 5/2009 | Okazaki et al. | 174/389 |
| 2009/0233006 | A1* | 9/2009 | Yamazaki et al. | 427/554 |
| 2011/0180796 | A1* | 7/2011 | Yamazaki et al. | 257/57 |
| 2011/0215358 | A1* | 9/2011 | Hwang et al. | 257/98 |

FOREIGN PATENT DOCUMENTS

JP    2009-130132    6/2009

OTHER PUBLICATIONS

Kashiwabara et al., "29.5L: Late-News Paper: Advanced AM-OLED Display Based on White Emitter With Microcavity Structure," SID 04 Digest, SID International Symposium Digest of Technical Papers 2004, vol. 35, pp. 1017-1019.

* cited by examiner

*Primary Examiner* — Thomas L Dickey
(74) *Attorney, Agent, or Firm* — Husch Blackwell LLP

(57) ABSTRACT

To provide a method for manufacturing light-emitting devices with different emission colors using EL layers formed using the same apparatus and condition, and a light-emitting device with high added value. A substrate in which a transparent conductive layer is formed in advance on a surface over which an EL layer is to be formed and another substrate in which a transparent conductive layer with a thickness different from that of the transparent conductive layer are prepared, and EL layers are formed over the substrates using the same apparatus and condition. Thus, even when the EL layers are formed using the same apparatus and condition, optical path lengths of the substrates can be different.

17 Claims, 11 Drawing Sheets

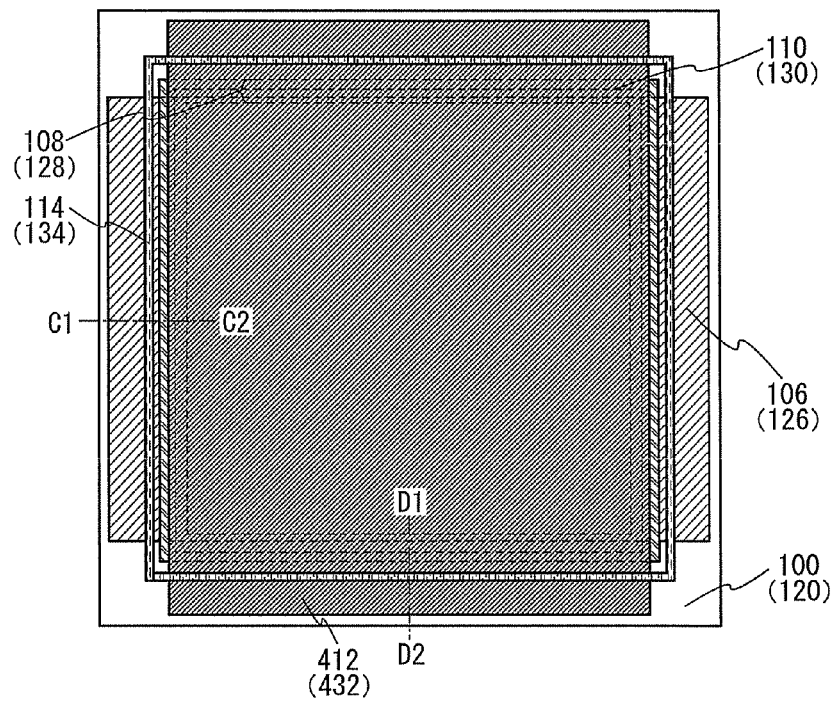
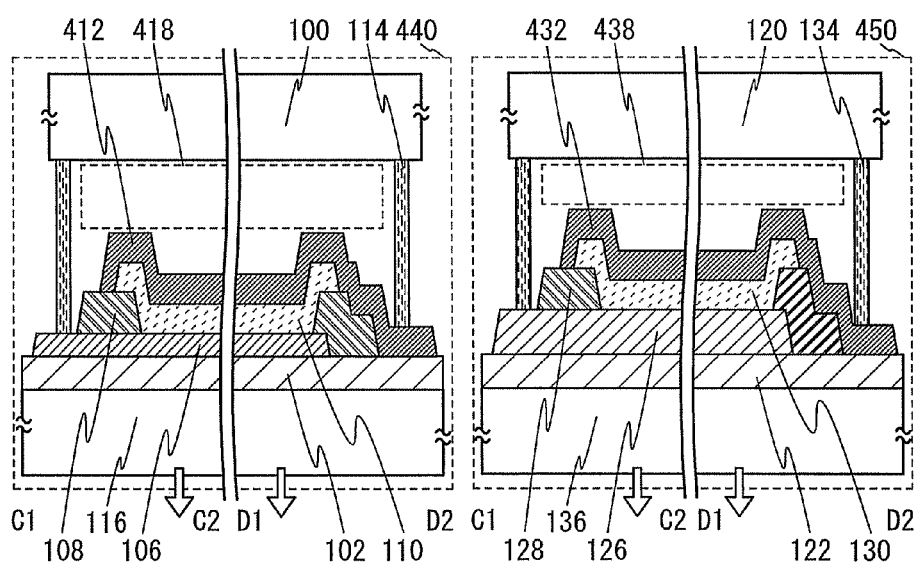

100  102  104

900

LIGHT-EMITTING DEVICE AND MANUFACTURING METHOD THEREOF

BACKGROUND OF THE INVENTION

1. Field of the Invention

The present invention relates to a light-emitting device and a manufacturing method thereof.

2. Description of the Related Art

Instead of light-emitting devices such as incandescent lamps and fluorescent lamps which have been used for a long time, in recent years, a light-emitting device using an element (hereinafter, abbreviated to an EL element) in which a functional thin film layer (hereinafter, abbreviated to an electroluminescence (EL) layer) which emits light by applying current is interposed between electrodes has been actively researched. A light-emitting device including an EL element has advantages that reduction in thickness and weight is easily conducted as compared to conventional light-emitting devices. The light-emitting device can be attached on a curved surface utilizing these advantages.

As an example of a light-emitting device including an EL element, a lighting device is disclosed in Patent Document 1.

REFERENCE

[Patent Document 1] Japanese Published Patent Application No. 2009-130132

SUMMARY OF THE INVENTION

Lighting devices with different emission colors are used in accordance with the purpose. For example, lighting devices whose emission color has a color temperature of around 3000 K, that is referred to as incandescent color, are generally used for a place with the purpose of feeling comfortable, e.g., a living room or a bathroom. Lighting devices whose emission color has a color temperature of around 5000 K, that is referred to as daylight white, are generally used for a place with the purpose of showing colors of vegetables, fruit, or the like closely to natural color, e.g., a food display shelf.

In the case of a light-emitting device including an EL element, in order to manufacture light-emitting devices with different emission colors, the following methods can be used, for example: a material for forming an EL layer is changed or the thickness of an EL layer is changed. However, conditions need to be changed every time a light-emitting device with a different emission color is manufactured, so that time for manufacturing the light-emitting device is greatly increased.

In the case where film formation is successively performed without changing conditions, the film formation can be performed using a plurality of devices in which materials or film formation conditions are different, for example. However, since the plurality of devices is used, initial investment cost, maintenance cost, and the like are largely increased.

The present invention is made in view of the foregoing technical background. Therefore, an object of one embodiment of the present invention is to provide a method for manufacturing light-emitting devices with different emission colors using EL layers formed using the same apparatus and condition.

Another object of one embodiment of the present invention is to provide a light-emitting device with high added value.

The present invention aims to achieve at least one of the above-described objects.

In order to achieve the above-described objects, in the present invention, a substrate in which a transparent conductive layer is formed in advance over a surface over which an EL layer is to be formed and a substrate in which a transparent conductive layer with a thickness different from that of the transparent conductive layer of the above substrate are prepared and EL layers are formed over these substrates using the same apparatus and condition. Thus, even when the EL layers are formed using the same apparatus and condition, optical path lengths of the substrates can be different.

Since a light-emitting device manufactured by the above-described method have different optical path lengths, light emitted from the EL layer optically resonates in the light-emitting device and light having a specific wavelength is strengthened or weakened depending on the optical path length.

Thus, even when EL layers formed using the same apparatus and condition are used, light-emitting devices with different emission colors can be manufactured.

In other words, according to one embodiment of the present invention, a method for manufacturing light-emitting devices includes the following steps: preparing a first base substrate in which a first transparent conductive layer is formed over an insulating surface and a second base substrate in which a second transparent conductive layer with a thickness different from that of the first transparent conductive layer is formed over an insulating surface; forming a first EL layer over the first transparent conductive layer; forming a second EL layer over the second transparent conductive layer using the same apparatus and condition as those of the first EL layer; forming a first conductive layer over the first EL layer; and forming a second conductive layer over the second EL layer.

According to the above embodiment of the present invention, since the first transparent conductive layer and the second transparent conductive layer have different thicknesses, optical path lengths of the light-emitting devices can be different even when the EL layers are formed using the same apparatus and condition; therefore, light-emitting devices with different emission colors can be manufactured using the EL layers formed using the same apparatus and condition.

In addition, when in a manufacture line for light-emitting devices with one emission color, a small number of light-emitting devices with a different emission color are needed, the both devices can be manufactured on the same manufacture line (that is, mixed production); therefore, light-emitting devices can be manufactured at low cost even in the case of low-volume production.

According to one embodiment of the present invention, a method for manufacturing light-emitting devices includes the following steps: preparing a first base substrate in which a first reflective layer and a first transparent conductive layer are formed in this order over an insulating surface and a second base substrate in which a second reflective layer and a second transparent conductive layer with a thickness different from that of the first transparent conductive layer are formed in this order over an insulating surface; forming a first EL layer over the first transparent conductive layer; forming a second EL layer over the second transparent conductive layer using the same apparatus and condition as those of the first EL layer; forming a first conductive layer having a light-transmitting property over the first EL layer; and forming a second conductive layer having a light-transmitting property over the second EL layer.

According to the above embodiment of the present invention, since the first transparent conductive layer and the second transparent conductive layer have different thicknesses, optical path lengths of the light-emitting devices can be different even when the EL layers are formed using the same apparatus and condition; therefore, light-emitting devices with different emission colors can be manufactured using the EL layers formed using the same apparatus and condition.

In addition, when in a manufacture line for light-emitting devices with one emission color, a small number of light-emitting devices with a different emission color are needed, the both devices can be manufactured on the same manufacture line (that is, mixed production); therefore, light-emitting devices can be manufactured at low cost even in the case of low-volume production.

According to one embodiment of the present invention, a top-emission type light-emitting device in which light is emitted in a direction opposite to the substrate over which the EL layer is formed can be manufactured; therefore, an EL layer is formed over a substrate having high thermal conductivity, such as a metal substrate, so that deterioration of the EL layer caused by heat generation of the light-emitting device itself can be suppressed.

Note that when a layer having a light reflectance of greater than or equal to 30% and a light transmittance of greater than or equal to 50% in a region with a wavelength of greater than or equal to 400 nm and less than or equal to 700 nm is formed as each of the first conductive layer and the second conductive layer, multiple reflection of part of light emitted from the first EL layer occurs between the first reflective layer and the first conductive layer and multiple reflection of part of light emitted from the second EL layer occurs between the second reflective layer and the second conductive layer; therefore, light having a specific wavelength is strengthened or weakened depending on the optical path length, and emission colors can be largely changed. Thus, light-emitting devices with largely different emission colors can be easily manufactured using the EL layers formed using the same apparatus and condition.

Further, when the first conductive layer and the second conductive layer are formed using the same apparatus and condition, the steps of forming the first EL layer and the first conductive layer and the steps of forming the second EL layer and the second conductive layer can be performed using the same apparatus and condition; therefore, light-emitting devices with different emission colors can be more easily manufactured using the EL layers formed using the same apparatus and condition.

According to one embodiment of the present invention, a method for manufacturing light-emitting devices includes the following steps: preparing a first base substrate in which a first transparent conductive layer is formed over a light-transmitting substrate having an insulating surface and a second base substrate in which a second transparent conductive layer with a thickness different from that of the first transparent conductive layer is formed over a light-transmitting substrate having an insulating surface; forming a first EL layer over the first transparent conductive layer; forming a second EL layer over the second transparent conductive layer using the same apparatus and condition as those of the first EL layer; forming a first reflective layer having conductivity over the first EL layer; and forming a second reflective layer having conductivity over the second EL layer.

According to the above embodiment of the present invention, since the first transparent conductive layer and the second transparent conductive layer have different thicknesses, optical path lengths of the light-emitting devices can be different even when the EL layers are formed using the same apparatus and condition; therefore, light-emitting devices with different emission colors can be manufactured using the EL layers formed using the same apparatus and condition.

In addition, when in a manufacture line for light-emitting devices with one emission color, a small number of light-emitting devices with a different emission color are needed, the both devices can be manufactured on the same manufacture line (that is, mixed production); therefore, light-emitting devices can be manufactured at low cost even in the case of low-volume production.

According to one embodiment of the present invention, bottom emission type light-emitting devices in which light is emitted in a direction of a substrate where an EL layer is formed can be manufactured; therefore, an EL layer can be sealed with a substrate (e.g., a metal substrate) having low moisture permeability in which a moisture absorbent is provided over a reflective layer, so that deterioration of a light-emitting state can be suppressed.

Note that when in a top-emission type light-emitting device in which light is emitted in a direction opposite to the substrate over which the EL layer is formed, which is manufactured according to the above embodiment of the present invention, a layer having a light reflectance of greater than or equal to 30% and a light transmittance of greater than or equal to 50% in a region with a wavelength of greater than or equal to 400 nm and less than or equal to 700 nm is formed as one or both of the first conductive layer and the second conductive layer, one or both of multiple reflection of part of light emitted from the first EL layer between the first reflective layer and the first conductive layer and multiple reflection of part of light emitted from the second EL layer between the second reflective layer and the second conductive layer occur; therefore, light having a specific wavelength is strengthened or weakened depending on the optical path length, and emission colors can be largely changed. Thus, light-emitting devices with largely different emission colors can be easily manufactured using the EL layers formed using the same apparatus and condition.

Further, when the first reflective layer and the second reflective layer are formed using the same apparatus and condition, the steps of forming the first EL layer and the first reflective layer and the steps of forming the second EL layer and the second reflective layer can be performed using the same apparatus and condition; therefore, light-emitting devices with different emission colors can be more easily manufactured using the EL layers formed using the same apparatus and condition.

According to one embodiment of the present invention, a method for manufacturing light-emitting devices includes the following steps: preparing a first base substrate in which a first reflective layer and a first transparent conductive layer formed to partly have a different thickness are formed in this order over an insulating surface and a second base substrate in which a second reflective layer and a second transparent conductive layer formed to partly have a different thickness are formed in this order over an insulating surface; forming a first EL layer over the first transparent conductive layer; forming a second EL layer over the second transparent conductive layer using the same apparatus and condition as those of the first EL layer; forming a first conductive layer having a light-transmitting property over the first EL layer; and forming a second conductive layer having a light-transmitting property over the second EL layer.

According to the above embodiment of the present invention, by the first transparent conductive layer and the second transparent conductive layer which are formed to partly have different thicknesses, a plurality of regions with, different optical path lengths can be formed in the same plane in each of the light-emitting device including the first base substrate, the first transparent conductive layer, the first EL layer, and the first reflective layer and the light-emitting device including the second base substrate, the second transparent conductive layer, the second EL layer, and the second reflective layer; therefore, emission colors are partly different even using the EL layers formed using the same apparatus and condition. Thus, light-emitting devices with different emission colors can be more easily manufactured using the EL layers formed using the same apparatus and condition.

Note that when in a top-emission type light-emitting device in which light is emitted in a direction opposite to the substrate over which the EL layer is formed, which is manufactured according to the above embodiment of the present invention, a layer having a light reflectance of greater than or equal to 30% and a light transmittance of greater than or equal to 50% in a region with a wavelength of greater than or equal to 400 nm and less than or equal to 700 nm is formed as one or both of the first conductive layer and the second conductive layer, one or both of multiple reflection of part of light emitted from the first EL layer between the first reflective layer and the first conductive layer and multiple reflection of part of light emitted from the second EL layer between the second reflective layer and the second conductive layer occur; therefore, light having a specific wavelength is strengthened or weakened depending on the optical path length, and emission colors can be largely changed. Thus, light-emitting devices with largely different emission colors can be easily manufactured even when a uniform EL layer is formed over the entire surface of each of the substrates.

According to one embodiment of the present invention, a method for manufacturing light-emitting devices includes the following steps: preparing a first base substrate in which a first transparent conductive layer formed to partly have a different thickness is formed over a light-transmitting substrate having an insulating surface and a second base substrate in which a second transparent conductive layer formed to partly have a different thickness is formed over a light-transmitting substrate having an insulating surface; forming a first EL layer over the first transparent conductive layer; forming a second EL layer over the second transparent conductive layer using the same apparatus and condition as those of the first EL layer; forming a first reflective layer having conductivity over the first EL layer; and forming a second reflective layer having conductivity over the second EL layer.

According to the above embodiment of the present invention, by the first transparent conductive layer and the second transparent conductive layer which are formed to partly have different thicknesses, a plurality of regions with different optical path lengths can be formed in the same plane in each of the light-emitting device including the first base substrate, the first transparent conductive layer, the first EL layer, and the first reflective layer and the light-emitting device including the second base substrate, the second transparent conductive layer, the second EL layer, and the second reflective layer; therefore, emission colors are partly different even using the EL layers formed using the same apparatus and condition. Thus, light-emitting devices with different emission colors can be more easily manufactured using the EL layers formed using the same apparatus and condition.

Further, according to one embodiment of the present invention, bottom emission type light-emitting devices in which light is emitted in a direction of a substrate where an EL layer is formed can be manufactured; therefore, an EL layer can be sealed with a substrate having low moisture permeability in which a moisture absorbent is provided over a reflective layer (e.g., a metal substrate), so that deterioration of a light-emitting state can be suppressed.

Note that when in a bottom emission type light-emitting device in which light is emitted in a direction of a substrate where an EL layer is formed, which is manufactured according to the above embodiment of the present invention, a layer having a light reflectance of greater than or equal to 30% and a light transmittance of greater than or equal to 50% in a region with a wavelength of greater than or equal to 400 nm and less than or equal to 700 nm is formed between the first light-transmitting substrate and the first transparent conductive layer, between the second light-transmitting substrate and the second transparent conductive layer, or both between the first light-transmitting substrate and the first transparent conductive layer and between the second light-transmitting substrate and the second transparent conductive layer, whereby one or both of multiple reflection of part of light emitted from the first EL layer between the first reflective layer and the first conductive layer and multiple reflection of part of light emitted from the second EL layer between the second reflective layer and the second conductive layer occur. Therefore, light having a specific wavelength is strengthened or weakened depending on the optical path length, and emission colors can be largely changed. Thus, light-emitting devices with largely different emission colors can be easily manufactured even when a uniform EL layer is formed over the entire surface of each of the substrates.

According to one embodiment of the present invention, a light-emitting device includes a reflective layer over a substrate having an insulating surface, a transparent conductive layer over the reflective layer, an EL layer over the transparent conductive layer, and a conductive layer over the EL layer. The transparent conductive layer includes a region with a partly different thickness. In other words, the transparent conductive layer includes a plurality of regions on a surface, each of the plurality of regions has its own thickness, and one thickness is different from another. The EL layer has the same composition on the entire surface.

According to the above embodiment of the present invention, a light-emitting device includes a region with a different optical path length; therefore, light emitted from the light-emitting device to the outside has a partly different emission color. Thus, a light-emitting device with high added value, e.g., a light-emitting device in which light emitted to the outside has a mosaic pattern or a light-emitting device in which a region with a different optical path length has a text shape and the text portion has a different emission color, can be provided.

Note that when in a top-emission type light-emitting device in which light is emitted in a direction opposite to the substrate over which the EL layer is formed, which is manufactured according to the above embodiment of the present invention, a layer having a light reflectance of greater than or equal to 30% and a light transmittance of greater than or equal to 50% in a region with a wavelength of greater than or equal to 400 nm and less than or equal to 700 nm is formed as the conductive layer, multiple reflection of part of light emitted from the EL layer occurs between the reflective layer and the conductive layer; therefore, light having a specific wavelength is strengthened or weakened depending on the optical path length, and emission colors can be largely changed. Thus, a light-emitting device in which part of emission colors is largely different can be manufactured.

According to one embodiment of the present invention, a light-emitting device includes a transparent conductive layer over a light-transmitting substrate having an insulating surface, an EL layer over the transparent conductive layer, and a reflective layer over the EL layer. The transparent conductive layer includes a region with a partly different thickness. The EL layer has the same composition on the entire surface.

The light-emitting device according to the above embodiment of the present invention includes a region with a different optical path length; therefore, light emitted from the light-emitting device to the outside has a partly different emission color. Thus, the light-emitting device can be a light-emitting device with high added value, e.g., light emitted to the outside can have a mosaic pattern.

Further, according to one embodiment of the present invention, a bottom emission type light-emitting device in which light is emitted in a direction of a substrate where an EL layer is formed can be manufactured; therefore, an EL layer can be sealed with a substrate having low moisture permeability in which a moisture absorbent is provided over a reflective layer (e.g., a metal substrate), so that a light-emitting device in which deterioration of the EL layer is suppressed can be provided.

Note that when in a bottom emission type light-emitting devices in which light is emitted in a direction of a substrate where an EL layer is formed, which is manufactured according to the above embodiment of the present invention, a layer having a light reflectance of greater than or equal to 30% and a light transmittance of greater than or equal to 50% in a region with a wavelength of greater than or equal to 400 nm and less than or equal to 700 nm is provided between the light-transmitting substrate and the transparent conductive layer, multiple reflection of part of light emitted from the EL layer occurs between the transparent conductive layer and the reflective layer; therefore, light having a specific wavelength is strengthened or weakened depending on the optical path length, and emission, colors can be largely changed. Thus, a light-emitting device with high added value in which part of emission colors is largely different can be manufactured.

According to one embodiment of the present invention, a light-emitting device includes a transparent conductive layer including a region with a continuously changed thickness.

According to the above embodiment of the present invention, since the light-emitting device includes a region with a continuously changed optical path length, light emitted from the light-emitting device to the outside has a continuously changed color. Thus, the light-emitting device can be a light-emitting device with high added value, for example, light emitted to the outside can have gradation.

When the expression "B is formed over A" or "B is formed on A" is explicitly described in this specification and the like, the expression is not limited to the fact that B is formed in direct contact with A. The expression includes the case where A and B are not in direct contact with each other, i.e., the case where another object is interposed between A and B.

Therefore, for example, when the expression that a layer B is formed on or over a layer A is explicitly described, the expression is intended to include both the case where the layer B is formed in direct contact with the layer A, and the case where another layer (e.g., a layer C or a layer D) is formed in direct contact with the layer A and the layer B is formed in direct contact with the other layer. Note that another layer (e.g., a layer C or a layer D) may be a single layer or a plurality of layers.

When the expression "A and B are formed in this order" is explicitly described in this specification and the like, the expression is not limited to the fact that B is formed just after A is formed. The expression includes the case where another object is formed between formation of A and B.

Therefore, for example, when the expression that a layer A and a layer B are formed in this order is explicitly described, the expression is intended to include both the case where the layer B is formed just after the layer A is formed, and the case where another layer (e.g., a layer C) is formed just after the layer A is formed, and then the layer B is formed.

Note that in this specification and the like, the ordinal number such as "first", "second", or "third" is given for convenience to distinguish elements, and not given to limit the number, the arrangement, and the order of the steps. Note that in this specification, steps in which films, layers, materials, substrates, and the like are formed over two substrates are described; therefore, different reference numerals are used for the same films, layers, materials, and substrates in some cases.

According to one embodiment of the present invention, a method for manufacturing light-emitting devices with different emission colors using EL layers formed using the same apparatus and condition can be provided.

Further, according to one embodiment of the present invention, a light-emitting device with high added value can be provided.

BRIEF DESCRIPTION OF THE DRAWINGS

FIGS. 4A to 4C illustrate structures of light-emitting devices described in Embodiment 1.

DETAILED DESCRIPTION OF THE INVENTION

Figure 1A:
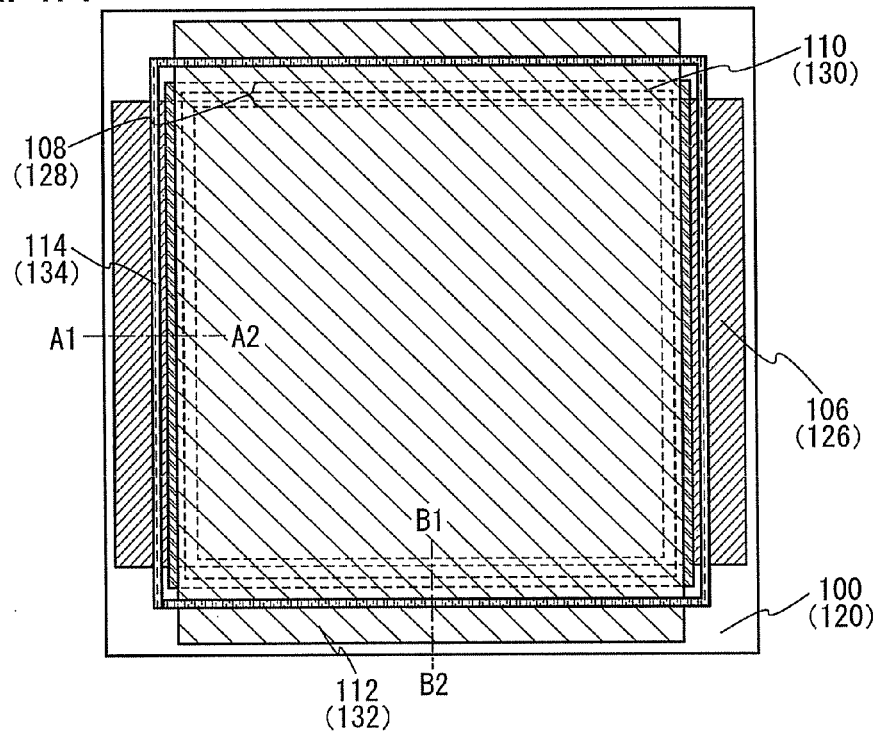
FIGS. 1A to 1C illustrate structures of light-emitting devices described in Embodiment 1.

Embodiments will be described with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

(Embodiment 1)

In this embodiment, a light-emitting device and a method for manufacturing light-emitting devices according to one embodiment of the disclosed invention are described with reference to FIGS. 1A to 1C, FIGS. 2A to 2D, FIGS. 3A to 3C, and FIGS. 4A to 4C.

<Structure of Light-Emitting Device in this Embodiment>

Figure 1B:
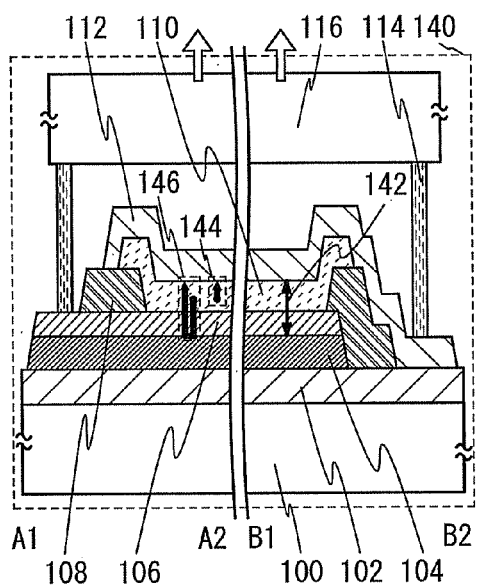
Figure 1C:
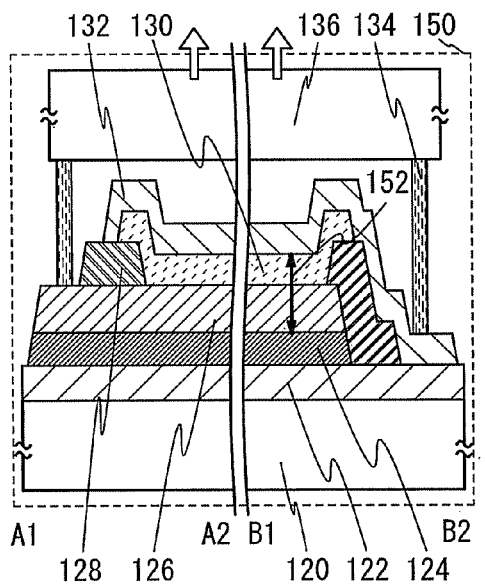

FIGS. 1A to 1C are structural examples of a light-emitting device manufactured by a method described in this embodiment, and FIG. 1A is a top view of a first light-emitting device 140 which is one of two light-emitting devices manufactured by a method described in this embodiment. Note that the first light-emitting device 140 and a second light-emitting device 150 have the same mode when seen from the above; therefore, FIG. 1A is also used for description of a top view of the second light-emitting device 150 and reference numerals shown in parentheses represent components used for the second light-emitting device 150. In the top view in FIG. 1A, in order to clarify the structure, only a film and layer on which pattern formation is performed are illustrated and a substrate which is formed on the uppermost surface is not illustrated.

FIG. 1B is a schematic cross-sectional view of the first light-emitting device 140 taken along dashed-dotted lines A1-A2 and B1-B2 in FIG. 1A, and FIG. 1C is a schematic cross-sectional view of the second light-emitting device 150 taken along dashed-dotted lines A1-A2 and B1-B2 in FIG. 1A.

The first light-emitting device 140 in FIG. 1B includes a first substrate 100, a first base layer 102 formed over the first substrate 100, a first reflective layer 104 formed over the first base layer 102, a first transparent conductive layer 106 formed over the first reflective layer 104, a first insulating layer 108 formed over the first transparent conductive layer 106, a first EL layer 110 formed over the first transparent conductive layer 106 and the first insulating layer 108, a first conductive layer 112 which covers the first EL layer and part of which is formed on an outer side of a first sealant 114, the first sealant 114 formed so as to surround the first EL layer 110 over the first substrate 100, and a second substrate 116 which is bonded to the first substrate 100 with the first sealant 114. Light emitted from the first EL layer 110 is extracted to the second substrate 116 side (in a direction-indicated by a white arrow in the drawing). In addition, part of the first transparent conductive layer 106 and part of the first conductive layer 112 are led to the outer side of the first sealant 114 and an external power source (not illustrated) is connected to the first transparent conductive layer 106 and the first conductive layer 112 to supply carriers to the first EL layer 110, so that the first EL layer 110 can emit light. Note that in the case where the resistance value of the first reflective layer 104 is smaller than or equal to that of the first transparent conductive layer 106, the first reflective layer 104 may be led to the outer side of the first sealant 114 and the external power source may be connected to the first reflective layer 104 and the first conductive layer 112. Needless to say, the first reflective layer 104 and the first transparent conductive layer 106 may be led to the outer side of the first sealant 114 as illustrated in FIG. 1B.

The second light-emitting device 150 in FIG. 1C includes a third substrate 120, a second base layer 122 formed over the third substrate 120, a second reflective layer 124 formed over the second base layer 122, a second transparent conductive layer 126 formed over the second reflective layer 124, a second insulating layer 128 formed over the second transparent conductive layer 126, a second EL layer 130 formed over the second transparent conductive layer 126 and the second insulating layer 128, a second conductive layer 132 which covers the second EL layer and part of which is formed on an outer side of a second sealant 134, the second sealant 134 formed so as to surround the second EL layer 130 over the third substrate 120, and a fourth substrate 136 which is bonded to the third substrate 120 with the second sealant 134. Light emitted from the second EL layer 130 is extracted to the fourth substrate 136 side (in a direction indicated by a white arrow in the drawing). In addition, part of the second transparent conductive layer 126 and part of the second conductive layer 132 are led to the outer side of the second sealant 134 and an external power source (not illustrated) is connected to the second transparent conductive layer 126 and the second conductive layer 132 to supply carriers to the second EL layer 130, so that the second EL layer 130 can emit light. Note that in the case where the resistance value of the second reflective layer 124 is smaller than or equal to that of the second transparent conductive layer 126, the second reflective layer 124 may be led to the outer side of the second sealant 134 and the external power source may be connected to the second reflective layer 124 and the second conductive layer 132. Needless to say, the second reflective layer 124 and the second transparent conductive layer 126 may be led to the outer side of the first sealant 134 as illustrated in FIG. 1C.

The first EL layer 110 includes at least a light-emitting layer containing a light-emitting organic compound. In addition, the first EL layer 110 can have a stacked-layer structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like are combined as appropriate. Examples of structures of the first EL layer 110 are described in detail in Embodiment 3. Since the second EL layer 130 is the same layer as the first EL layer 110 using the same apparatus and condition as those of the first EL layer 110, Embodiment 3 is referred to for the details.

As described above, the first EL layer 110 formed in the first light-emitting device 140 in FIG. 1B and the second EL layer 130 formed in the second light-emitting device 150 in FIG. 1C are formed using the same apparatus and condition; therefore, light generated in the first EL layer 110 and light generated in the second EL layer 130 have the same color.

Here, in this embodiment, before the first EL layer 110 and the second EL layer 130 are formed, the first transparent conductive layer 106 and the second transparent conductive layer 126 which has a different thickness from that of the first transparent conductive layer 106 are respectively formed over the first substrate 100 and the third substrate 120 in advance. Thus, even in the case where the first EL layer 110 and the second EL layer 130 are formed using the same apparatus and condition, a first optical path length 142 between the first reflective layer 104 and the first conductive layer 112 and a second optical path length 152 between the second reflective layer 124 and the second conductive layer 132 are different.

Since light from the first EL layer 110 is emitted in all directions in the first light-emitting device 140, for example, a light 144 which is emitted from the first EL layer 110 to the first conductive layer 112 side and a light 146 which is emitted from the first EL layer 110 to the first reflective layer 104 side and reflected interfere with each other and light having a specific wavelength is strengthened or weakened depending on the first optical path length 142; therefore, a color of light extracted from the first light-emitting device 140 to the outside is different from an emission color of the first EL layer 110. Note that the light 146 which is emitted to the first reflective layer 104 side and reflected is represented by the alphabet U and the light 146 seems to travel along an interface direction between the first reflective layer 104 and the first transparent conductive layer 106 in FIG. 1B; however, this is for easy understanding of the drawings, and actually, the light does not travel along the interface direction.

Also in the second light-emitting device 150, as described above, the color of light extracted to the outside is different from an emission color of the second EL layer 130; however, the color of light extracted from the second light-emitting device 150 to the outside and the color of light extracted from the first light-emitting device 140 to the outside are different because the length of the second optical path length 152 and the length of the first optical path length 142 are different.

Therefore, even when the first EL layer 110 and the second EL layer 130 are formed using the same apparatus and condition, the first light-emitting device 140 and the second light-emitting device 150 which have different emission colors can be manufactured.

When a semi-light-transmitting layer having a light reflectance of greater than or equal to 30% and a light transmittance of greater than or equal to 50% in a region with a wavelength of greater than or equal to 400 nm and less than or equal to 700 nm is formed as each of the first conductive layer 112 and the second conductive layer 132, light emitted from the first EL layer 110 and light emitted from the second EL layer 130 resonate by multiple reflection, that is, a function as a so-called microcavity can be provided. Thus, the difference between the emission colors of the first light-emitting device 140 and the second light-emitting device 150 becomes more significant.

<Method for Manufacturing Light-Emitting Devices in this Embodiment>

A method for manufacturing light-emitting devices of this embodiment is described below with reference to FIGS. 2A to 2D and FIGS. 3A to 3C.

In FIGS. 2A to 2D and FIGS. 3A to 3C, a method for forming the first light-emitting device 140 and a method for forming the second light-emitting device 150 are respectively illustrated on the left side and the right side of a long dashed double-short dashed line.

Figure 2A:
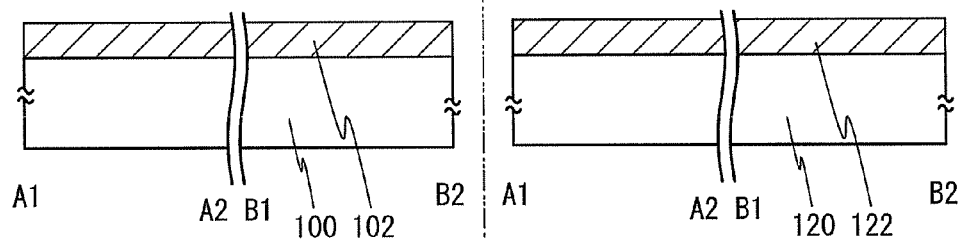
FIGS. 2A to 2D illustrate a method for manufacturing light-emitting devices described in Embodiment 1.

First, the first substrate 100 and the third substrate 120 are prepared, and the first base layer 102 and the second base layer 122 are formed over the first substrate 100 and the third substrate 120, respectively (see FIG. 2A).

Any substrate having an insulating surface can be used as the first substrate 100 and the third substrate 120. For example, a non-alkali glass substrate such as an aluminosilicate glass substrate, an aluminoborosilicate glass substrate, or a barium borosilicate glass substrate can be used. Such a glass substrate is suitable for increasing in size, so that glass substrates of G10 size (2850 mm×3050 mm), G11 size (3000 mm×3320 mm), and the like are manufactured; thus, the light-emitting device according to one embodiment of the present invention can be mass-produced at low cost. Alternatively, an insulating substrate formed using an insulator, such as a quartz substrate or a sapphire substrate, or a semiconductor substrate formed using a semiconductor material such as silicon whose surface is covered with an insulating material can be used.

In this embodiment, in the case where light from the first EL layer 110 and light from the second EL layer 130 are emitted in directions opposite to the first substrate 100 and the third substrate 120, a conductive substrate formed using a conductor such as metal or stainless steel whose surface is covered with an insulating layer or a conductive thin film whose surface is covered with an insulating material can be used as the first substrate 100 and the third substrate 120. These substrates have higher thermal conductivity than a glass substrate or the like; therefore, heat generated in the first EL layer 110 and the second EL layer 130 is easily released to the outside. Thus, deterioration due to heat of the first EL layer 110 and the second EL layer 130 can be suppressed.

As each of the first substrate 100 and the third substrate 120, any of a variety of plastic substrates formed of ethylene vinyl acetate (EVA), a polyethylene terephthalate resin (PET), a polyether sulfone resin (PES), a polyethylene naphthalate resin (PEN), a polyvinyl alcohol resin (PVA), a polycarbonate resin (PC), a polyethylene resin (PE), an ABS resin, and the like can also be used. Note that in the case where the above plastic substrate is used as each of the first substrate 100 and the third substrate 120, a single layer or a stacked layer of a film having low water vapor permeability of silicon oxide, silicon nitride, silicon oxynitride, silicon nitride oxide, aluminum oxide, or the like is preferably formed on its surface. Thus, deterioration of the first EL layer 110 and the second EL layer 130 can be suppressed because the plastic substrate has a high barrier property against water vapor.

When the above plastic substrate is used as each of the first substrate 100 and the third substrate 120, the first light-emitting device 140 and the second light-emitting device 150 can be reduced in thickness and weight and have more flexibility, so that the light-emitting devices can have higher added value.

Note that the materials and thicknesses of the first substrate 100 and the third substrate 120 may be the same or different. There is no particular limitation on the thicknesses; however, the thickness is preferably less than or equal to 3 mm, more preferably less than or equal to 1 mm in terms of reduction in thickness and weight of each of the light-emitting devices.

As an example, a stainless steel substrate with a thickness of 0.3 mm may be used as each of the first substrate 100 and the third substrate 120.

The first base layer 102 and the second base layer 122 prevent impurity diffusion from the first substrate 100 and the third substrate 120, respectively. The first base layer 102 and the second base layer 122 may be formed by a known method, e.g., a CVD method such as a plasma CVD method, a PVD method, or a sputtering method, using silicon oxide ($SiO_2$), silicon nitride (SiN), silicon oxynitride (SiON), silicon nitride oxide (SiNO), aluminum oxide ($AlO_2$), aluminum nitride (AlN), aluminum oxynitride (AlON), aluminum nitride oxide (AlNO), or the like. Note that the first base layer 102 and the second base layer 122 may have a single-layer structure or a stacked-layer structure. In the case of a stacked-layer structure, the above films may be combined to form the first base layer 102 and the second base layer 122.

Note that in the above description, the terms "oxynitride" and "nitride oxide" are used. They represent which of the content of oxygen and the content of nitrogen contained in a formed layer is large, and "oxynitride" means that the layer contains more oxygen than nitrogen.

Note that the materials and thicknesses of the first base layer 102 and the second base layer 122 may be the same or different. There is no particular limitation on the thicknesses; a thickness of greater than or equal to 10 nm and less than or equal to 500 nm is preferable, for example. When the thickness is less than 10 nm, the first base layer 102 or the second base layer 122 might not be formed in some regions because of thickness distribution within a substrate surface due to a deposition apparatus. In addition, when the thickness is greater than 500 nm, deposition time and manufacturing cost might be increased.

The first base layer 102 and the second base layer 122 may be formed using the same apparatus or different apparatuses; however, the same apparatus and condition are preferably employed in terms of suppression of formation time and cost.

In that case, it is more preferable that base layers be formed over a plurality of substrates at the same time.

For example, a silicon oxide layer with a thickness of 100 nm may be formed over the first substrate 100 and the third substrate 120 by a plasma CVD method and used as the first base layer 102 and the second base layer 122.

Note that in the case where a layer having an effect of preventing impurity diffusion which the first base layer 102 has is already formed on a surface of the first substrate 100, the first base layer 102 is not necessarily provided. The same applies to the second base layer 122 which is formed on a surface of the third substrate 120.

Figure 2B:
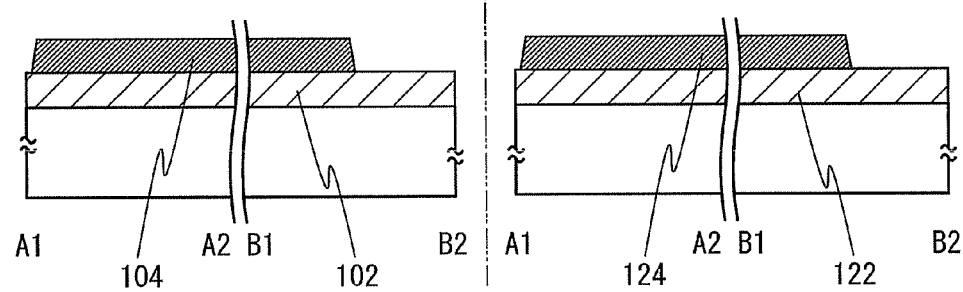

Next, the first reflective layer 104 and the second reflective layer 124 are formed over the first base layer 102 and the second base layer 122, respectively (see FIG. 2B).

The first reflective layer 104 and the second reflective layer 124 are a layer for reflecting light emitted from the first EL layer 110 and a layer for reflecting light emitted from the second EL layer 130 which are formed in a later step, respectively. Each of the first reflective layer 104 and the second reflective layer 124 can be formed in such a manner that a metal layer having a high reflectance is formed by a known method, e.g., a sputtering method or a variety of evaporation methods such as a vacuum evaporation method, and selectively removed by a known method, e.g., a dry etching method or a wet etching method using a photo resist mask. The metal film having a high reflectance can be formed using a single layer or a stacked layer using aluminum, silver, an alloy containing such a metal material, or the like. A stacked layer of a metal film having a high reflectance and a thin metal film (preferably with a thickness of 20 nm or less, more preferably 10 nm or less) may be used. For example, it is preferable to form a thin titanium film by which formation of an insulating film between the first EL layer 110 or the second EL layer 130, and the metal film having a high reflectance (aluminum, an alloy containing aluminum, silver, or the like) can be suppressed. The thin metal film may be oxidized; in that case, a material which is unlikely to be insulated by oxidation, such as titanium or molybdenum, is preferably used.

Note that the materials and thicknesses of the first reflective layer 104 and the second reflective layer 124 may be the same or different. There is no particular limitation on the thicknesses; a thickness of greater than or equal to 10 nm and less than or equal to 300 nm is preferable, for example. When the thickness is less than 10 nm, the first reflective layer 104 or the second reflective layer 124 might not be formed in some regions because of thickness distribution within a substrate surface due to a deposition apparatus and a desired reflection effect might not be obtained. In addition, when the thickness is greater than 300 nm, deposition time and manufacturing cost might be increased.

The first reflective layer 104 and the second reflective layer 124 may be formed using the same apparatus or different apparatuses; however, the same apparatus and condition are preferably employed in terms of suppression of formation time and cost. In that case, it is more preferable that reflective layers be formed over a plurality of substrates at the same time.

For example, a layer of an alloy of aluminum and titanium with a thickness of 100 nm and a layer of titanium with a thickness of 10 nm are formed in this order over each of the first base layer 102 and the second base layer 122 by a sputtering method, and then pattern formation treatment is performed as appropriate to form the first reflective layer 104 and the second reflective layer 124.

Figure 2C:
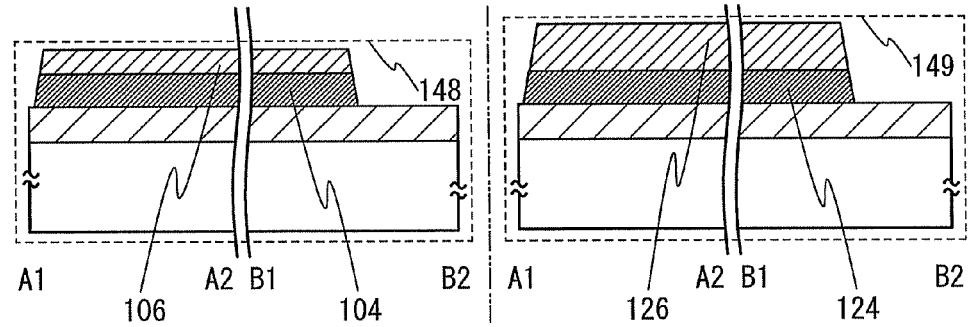

Next, the first transparent conductive layer 106 and the second transparent conductive layer 126 are formed over the first reflective layer 104 and the second reflective layer 124, respectively (see FIG. 2C).

The first transparent conductive layer 106 and the second transparent conductive layer 126 are layers for controlling optical path lengths of the first light-emitting device 140 and the second light-emitting device 150, respectively. At least one of the first transparent conductive layer 106 and the above-described first reflective layer 104 serves as one of electrodes between which the first EL layer 110 formed in a later step is sandwiched. At least one of the second transparent conductive layer 126 and the above-described second reflective layer 124 serves as one of electrodes between which the second EL layer 130 formed in a later step is sandwiched.

The first transparent conductive layer 106 and the second transparent conductive layer 126 can be formed in such a manner that a conductive metal oxide layer is formed by a known method, e.g., a CVD method such as a plasma CVD method, a PVD method, or a sputtering method and then selectively removed by a known method, e.g., a dry etching method or a wet etching method using a photo resist mask. As the conductive metal oxide, for example, indium oxide ($In_2O_3$), tin oxide ($SnO_2$), zinc oxide (ZnO), indium oxide and tin oxide ($In_2O_3$—$SnO_2$, abbreviated to ITO), indium oxide and zinc oxide ($In_2O_3$—ZnO), indium oxide containing tungsten oxide and zinc oxide (IWZO), or any of these metal oxide materials containing silicon or silicon oxide can be used. A film of indium oxide containing tungsten oxide and zinc oxide (IWZO) can be formed by a sputtering method using a target in which tungsten oxide and zinc oxide are mixed at 0.5 to 5 wt % and 0.1 to 1 wt %, respectively, with indium oxide. Note that the first transparent conductive layer 106 and the second transparent conductive layer 126 may have a single-layer structure or a stacked-layer structure. In the case of a stacked-layer structure, the above films may be combined to form the first transparent conductive layer 106 and the second transparent conductive layer 126.

Note that the materials of the first transparent conductive layer 106 and the second transparent conductive layer 126 may be the same or different. The first transparent conductive layer 106 and the second transparent conductive layer 126 need to have different thicknesses so that emission colors are different using the difference between the first optical path length 142 and the second optical path length 152 as described above in this embodiment. There is no particular limitation on the thicknesses of the transparent conductive layers; a thickness of greater than or equal to 10 nm and less than or equal to 300 nm is preferable, for example. When the thickness is less than 10 nm, the first transparent conductive layer 106 or the second transparent conductive layer 126 might not be formed in some regions because of thickness distribution within a substrate surface due to a deposition apparatus. In addition, when the thickness is greater than 300 nm, deposition time, manufacturing cost, power consumption due to an increase in light absorption, and the like might be increased.

The first transparent conductive layer 106 and the second transparent conductive layer 126 may be formed using the same apparatus or different apparatuses; however, the same apparatus and condition are preferably employed in terms of suppression of formation time and cost. In that case, transparent conductive layers with the same thickness are formed over a plurality of substrates at the same time; or a plurality of substrates is introduced into an apparatus at the same time, and some substrates are taken out during film formation so that transparent conductive layers with different thicknesses are formed over the plurality of substrates.

For example, a layer of indium oxide and tin oxide to which silicon oxide is added with a thickness of 50 nm is formed over the first reflective layer 104 by a sputtering method and subjected to pattern formation treatment as appropriate to form the first transparent conductive layer 106, and then with the use of the same apparatus, a layer of indium oxide and tin oxide to which silicon oxide is added with a thickness of 150 nm is formed over the second reflective layer 124 by a sputtering method and subjected to pattern formation treatment as appropriate to form the second transparent conductive layer 126.

Through the above steps, a first base substrate 148 in which the first base layer 102, the first reflective layer 104, and the first transparent conductive layer 106 are formed in this order over the first substrate 100 and a second base substrate 149 in which the second base layer 122, the second reflective layer 124, and the second transparent conductive layer 126 are formed in this order over the third substrate 120 are prepared (see FIG. 1C).

Although the first reflective layer 104 and the first transparent conductive layer 106 are separately formed in this embodiment, the first reflective layer 104 and the first transparent conductive layer 106 may be formed in such a manner that a layer serving as the first reflective layer 104 and a layer serving as the first transparent conductive layer 106 are formed at a time and selectively removed by a known method, e.g., a dry etching method or a wet etching method using a photo resist mask. Thus, a step of forming a mask and an etching step can be reduced, resulting in a reduction in manufacturing time and cost. Misalignment of pattern formation of the first reflective layer 104 and the first transparent conductive layer 106 can be prevented. Note that the second reflective layer 124 and the second transparent conductive layer 126 may be subjected to treatment in a similar manner.

Figure 2D:
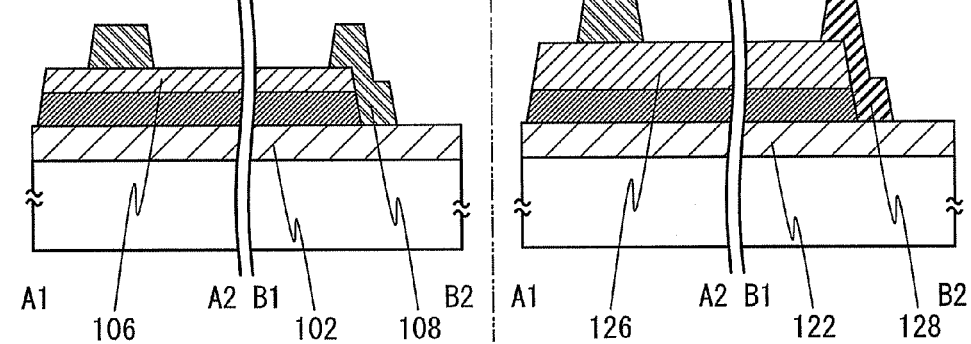

Next, the first insulating layer 108 is formed over the first base layer 102 and the first transparent conductive layer 106, and the second insulating layer 128 is formed over the second base layer 122 and the second transparent conductive layer 126 (see FIG. 2D).

The first insulating layer 108 is a layer for preventing the first conductive layer 112 formed in a later step from being in contact with the first reflective layer 104 and the first transparent conductive layer 106, and the second insulating layer 128 is a layer for preventing the second conductive layer 132 formed in the later step from being in contact with the second reflective layer 124 and the second transparent conductive layer 126. The first insulating layer 108 and the second insulating layer 128 can be formed in such a manner that coating is performed by a known method, e.g., a spin coating method, a printing method, a dispense method, or an inkjet method and cure treatment (e.g., heat treatment or light irradiation treatment) is performed as appropriate. Note that in the case of employing a spin coating method, pattern formation treatment (e.g., a photo-curable resin is applied on an entire surface, a necessary portion is irradiated with light, and then a resin of an unnecessary portion is removed) is preferably performed as appropriate. The first insulating layer 108 and the second insulating layer 128 can be formed using, for example, an organic resin such as an acrylic resin, a polyimide resin, a polyamide resin, a polyamide imide resin, or an epoxy resin.

Note that the materials and thicknesses of the first insulating layer 108 and the second insulating layer 128 may be the same or different. There is no particular limitation on the thicknesses; an angle of an end portion of each of the first insulating layer 108 and the second insulating layer 128 is preferably less than or equal to 600, more preferably less than or equal to 40°. Since the first EL layer 110 and the second EL layer 130 are respectively formed over the first insulating layer 108 and the second insulating layer 128 in a later step, disconnection of the first EL layer 110 and the second EL layer 130 can be prevented with such a low angle.

The first insulating layer 108 and the second insulating layer 128 may be formed using the same apparatus or different apparatuses; however, the same apparatus and condition are preferably employed in terms of suppression of formation time and cost.

For example, after a polyimide resin is applied over the first substrate 100 and the third substrate 120 by a spin coating method, pattern formation treatment and curing are performed depending on characteristics of the polyimide resin as appropriate to form the first insulating layer 108 and the second insulating layer 128.

Although the first insulating layer 108 and the second insulating layer 128 are formed in this embodiment, they are not necessarily formed. For example, in the case where an insulating state between the first reflective layer 104 or the first transparent conductive layer 106, and the first conductive layer 112 formed in the later step can be kept by the first EL layer 110 formed in the later step, the first insulating layer 108 is not necessarily formed. Similarly, in the case where an insulating state between the second reflective layer 124 or the second transparent conductive layer 126, and the second conductive layer 132 can be kept by the second EL layer 130, the second insulating layer 128 is not necessarily formed.

Figure 3A:
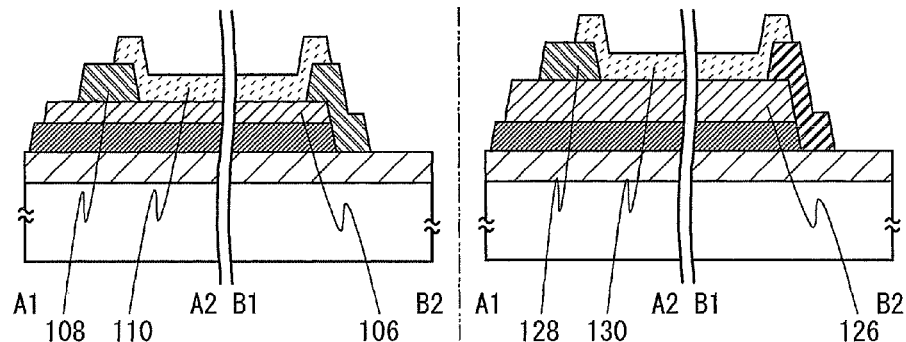
FIGS. 3A to 3C illustrate a method for manufacturing light-emitting devices described in Embodiment 1.

Next, the first EL layer 110 is formed over the first transparent conductive layer 106 and the first insulating layer 108, and the second EL layer 130 is formed over the second transparent conductive layer 126 and the second insulating layer 128 (see FIG. 3A).

The first EL layer 110 and the second EL layer 130 are layers which emit light by application of current and can be formed by a known method, e.g., an evaporation method. The first EL layer 110 and the second EL layer 130 may be formed using a material and a structure described in Embodiment 3. Alternatively, a known material may be used instead of the material described in Embodiment 3. Further, the material may be selected as appropriate depending on the intended use of the light-emitting device. For example, in the case where the light-emitting device is used for indoor lighting such as an incandescent lamp or a fluorescent lamp, the first EL layer 110 and the second EL layer 130 may have a three-layer structure in which light of red (R), green (G), and blue (B) are emitted to exhibit light emission of white color, e.g., daylight color or day white color. Alternatively, layers which emits light of complementary colors (e.g., a combination of cyan (C: light blue) and yellow (Y)) may be stacked. The method for stacking EL layers will be described in detail in Embodiment 3.

As formation methods of the first EL layer 110 and the second EL layer 130, for example, a vacuum evaporation method such as a resistive heating evaporation method or an electron-beam evaporation method can be employed. Note that the first EL layer 110 and the second EL layer 130 are significantly deteriorated due to water, oxygen, or the like in the air; therefore, the first EL layer 110 and the second EL layer 130 are preferably formed more on the inside than the first sealant 114 and the second sealant 134 which are formed in a later step (on the side closer to the center portion of the substrate). As a method for forming an EL layer at such a predetermined position, a metal mask or the like is used, for example.

In this embodiment, the first EL layer 110 and the second EL layer 130 are formed using the same apparatus and condition. The expression "formation using the same apparatus" means not only formation using the same apparatus but also formation using the same apparatus and the same chambers. For example, in the case where there are six evaporation chambers (also referred to as deposition chambers) M1, M2, M3, M4, M5, and M6 in an apparatus X and the first EL layer 110 is formed using the evaporation chambers M1, M2, M3, M5, and M6 in the apparatus X, the second EL layer 130 is also formed using the evaporation chambers M1, M2, M3, M5, and M6 in the apparatus X. In addition, the expression "formation using the same condition" means as follows: in the case where the first EL layer 110 has a five-layer structure of an N1 layer, an N2 layer, an N3 layer, an N4 layer, and an N5 layer, the second EL layer 130 also has the five-layer structure of the N1 layer, the N2 layer, the N3 layer, the N4 layer, and the N5 layer and a formation condition of each chamber is the same set value. Note that even when variation in the apparatus state (e.g., unintended temperature change of an melting pot used for evaporation of an organic material or unintended variation of a deposition rate caused by a residual amount of an organic material) occurs during formation of the first EL layer 110 and the second EL layer 130, such a formation condition is also regarded as "the same condition".

In the case where light-emitting devices with different emission colors are manufactured, the following method are generally used: a material for forming an EL layer is changed; the thickness of an EL layer is changed; or the like. However, as described above, when the first EL layer 110 and the second EL layer 130 are formed using the same apparatus and condition, the use of a plurality of devices, an increase in the number of chambers in an apparatus, and an appropriate change of a condition are unnecessary; therefore, not only manufacturing time and cost of a light-emitting device but also time and cost required for device maintenance can be significantly reduced, so that inexpensive light-emitting devices can be manufactured.

Figure 3B:
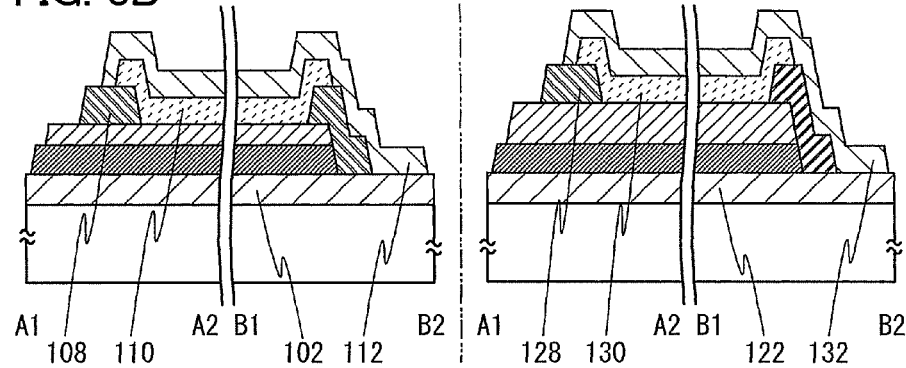
Figure 3C:
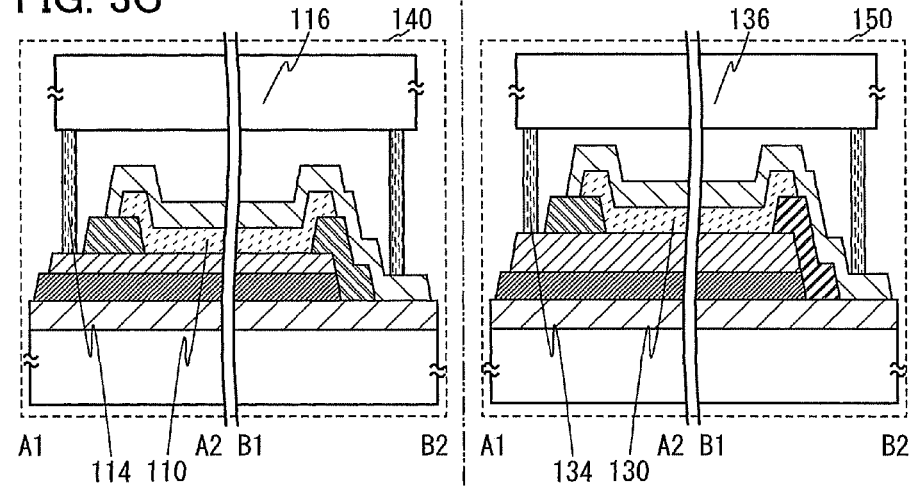

Next, the first conductive layer 112 is formed over the first base layer 102, the first insulating layer 108, and the first EL layer 110, and the second conductive layer 132 is formed over the second base layer 122, the second insulating layer 128, and the second EL layer 130 (see FIG. 3B).

The first conductive layer 112 serves as the other of the electrodes between which the first EL layer 110 is sandwiched, and the second conductive layer 132 serves as the other of the electrodes between which the second EL layer 130 is sandwiched.

This embodiment is a top emission type light-emitting device in which light is emitted from the side opposite to the substrate over which an EL layer is formed; therefore, a light-transmitting layer needs to be formed as each of the first conductive layer 112 and the second conductive layer 132. Specifically, a layer having a light transmittance of greater than or equal to 60%, preferably greater than or equal to 80% in a region with a wavelength of greater than or equal to 400 nm and less than or equal to 700 nm is preferably formed. As such a layer, a layer similar to the first transparent conductive layer 106 or the second transparent conductive layer 126 can be used. In the case where the first conductive layer 112 and the second conductive layer 132 are formed by a sputtering method, a method which causes less damage to the first EL layer 110 and the second EL layer 130 such as a facing target sputtering method (also referred to as a mirrortron sputtering method) is preferably used.

In the case where layers similar to the first transparent conductive layer 106 and the second transparent conductive layer 126 are used as the first conductive layer 112 and the second conductive layer 132, such transparent conductive layers generally have higher resistance values than a metal layer. Therefore, layers or materials having low resistance values may be formed in contact with the first conductive layer 112 and the second conductive layer 132, although not illustrated in the drawings in this embodiment. In that case, such layers or materials are preferably formed so that their light transmittances are not less than the above light transmittance range. For example, over each of the first conductive layer 112 and the second conductive layer 132, an aluminum wiring with a width of less than or equal to 1 mm may be evaporated using a metal mask so as to be formed in a grid. Needless to say, a method for forming a layer or a material having a low resistance value is not limited thereto; a variety of known methods can be used.

A semi-light-transmitting conductive layer may be formed over one or both of the first conductive layer 112 and the second conductive layer 132. Specifically, a layer having a light reflectance of greater than or equal to 30% and a light transmittance of greater than or equal to 50% in a region with a wavelength of greater than or equal to 400 nm and less than or equal to 700 nm is preferably formed. For example, the semi-light-transmitting conductive layer may be formed by a known method, e.g., a sputtering method or an evaporation method, using any of the following: an element belonging to Group 1 or Group 2 in the periodic table, that is, an alkali metal such as lithium or cesium, an alkaline earth metal such as calcium or strontium, magnesium; an alloy thereof (e.g., Mg—Ag or Al—Li); a rare earth metal such as europium or ytterbium; and an alloy thereof. Silver, aluminum, and alloy thereof may be formed so as to have a light reflectance of greater than or equal to 30% and a light transmittance of greater than or equal to 50% in a region with a wavelength of greater than or equal to 400 nm and less than or equal to 700 nm.

Alternatively, as the first conductive layer 112, a light-transmitting layer and a semi-light-transmitting layer may be stacked. For example, in the first light-emitting device 140, the above semi-light-transmitting layer is formed over the first EL layer 110, a layer similar to the first transparent conductive layer 106 is formed, and then this layer can be used as the first conductive layer 112. Needless to say, the same can be said for the second light-emitting device 150.

In the case where a light-transmitting layer and a semi-light-transmitting layer are stacked, when the light-transmitting layer has sufficiently low resistance, the semi-light-transmitting layer does not necessarily have conductivity.

When a semi-light-transmitting layer or a stack of a light-transmitting layer and a semi-light-transmitting layer is formed as each of the first conductive layer 112 and the second conductive layer 132 as described above, for example, in the first light-emitting device 140, multiple reflection of part of light emitted from the first EL layer 110 occurs between the first reflective layer 104 and the first conductive layer 112 and light having a specific wavelength is strengthened or weakened depending on the optical path length, that is, a function as a so-called micro optical resonator (microcavity) can be provided.

As the first sealant 114 and the second sealant 134, any of a variety of curable adhesives, for example, a photo-curable adhesive such as a UV curable adhesive, a reactive curable adhesive, a thermosetting adhesive, and an anaerobic adhesive may be used. The first sealant 114 and the second sealant 134 each may contain a spacer material.

The number of each of the first sealants 114 and the second sealants 134 which are formed is one in this embodiment;

however, a plurality of sealants, e.g., two or three sealants, may be formed. By formation of a plurality of sealants, entry of moisture and oxygen from the outside can be effectively suppressed, whereby a light-emitting element having a long lifetime can be manufactured.

Since the light-emitting devices of this embodiment are a top emission type, a light-transmitting substrate, e.g., a non-alkali glass substrate such as an aluminosilicate glass substrate, an aluminoborosilicate glass substrate, or a barium borosilicate glass substrate, can be used as each of the second substrate 116 and the fourth substrate 136. Such a glass substrate is suitable for increasing in size, so that glass substrates of G10 size (2850 mm×3050 mm), G11 size (3000 mm×3320 mm), and the like are manufactured; thus, the light-emitting device according to one embodiment of the present invention can be mass-produced at low cost. Such a glass substrate has a high barrier property against water vapor. Alternatively, a quartz substrate or the like can be used.

As each of the second substrate 116 and the fourth substrate 136, any of a variety of plastic substrates formed of ethylene vinyl acetate (EVA), a polyethylene terephthalate resin (PET), a polyether sulfone resin (PES), a polyethylene naphthalate resin (PEN), a polyvinyl alcohol resin (PVA), a polycarbonate resin (PC), a polyethylene resin (PE), an ABS resin, and the like can also be used. Note that in the case where the above plastic substrate is used as each of the second substrate 116 and the fourth substrate 136, a single layer or a stacked layer of a film having low water vapor permeability of silicon oxide, silicon nitride, silicon oxynitride, silicon nitride oxide, aluminum oxide, or the like is preferably formed on its surface. Thus, deterioration of the first EL layer 110 and the second EL layer 130 can be suppressed because the plastic substrate has a high barrier property against water vapor.

When the above plastic substrate is used as each of the second substrate 116 and the fourth substrate 136, the first light-emitting device 140 and the second light-emitting device 150 can be reduced in thickness and weight and have more flexibility, so that the light-emitting devices can have higher added value.

Note that the materials and thicknesses of the second substrate 116 and the fourth substrate 136 may be the same or different. There is no particular limitation on the thicknesses; however, the thickness is preferably less than or equal to 3 mm, more preferably less than or equal to 1 mm in terms of reduction in thickness and weight of each of the light-emitting devices.

When the second substrate 116 and the fourth substrate 136 are respectively bonded onto the first substrate 100 and the third substrate 120, the bonding is preferably performed under reduced pressure or an atmosphere of an inert gas such as nitrogen. Thus, a space surrounded by the substrates and the sealant is under reduced pressure or filled with an inert gas; therefore, the deterioration of the first EL layer 110 and the second EL layer 130 caused by moisture, oxygen, or the like can be suppressed.

For example, as the first sealant 114 and the second sealant 134, an ultraviolet curable adhesive is formed more on the outside than the first EL layer 110 over the first substrate 100 and the outside than the second EL layer 130 over the third substrate 120 by a dispenser, and then the second substrate 116 and the fourth substrate 136 which are formed using non-alkali glass with a thickness of 0.3 mm are respectively bonded onto the first substrate 100 and the third substrate 120 in a reduced pressure atmosphere.

<Effect of Light-Emitting Devices Manufactured in this Embodiment>

In the first light-emitting device 140 in FIG. 1B and the second light-emitting device 150 in FIG. 1C which are manufactured through the above steps, the first transparent conductive layer 106 and the second transparent conductive layer 126 which have different thicknesses are respectively formed over the first reflective layer 104 and the second reflective layer 124; therefore, even when the first EL layer 110 and the second EL layer 130 are formed using the same apparatus and condition (in other words, even when the materials and thicknesses of the EL layers are the same), the first light-emitting device 140 and the second light-emitting device 150 can have different optical path lengths.

Thus, in light emitted from the first EL layer 110 and light emitted from the second EL layer 130, light having a specific wavelength is strengthened or weakened depending on the optical path length and then extracted from each of the light-emitting devices; therefore, light extracted from the first light-emitting device 140 and light extracted from the second light-emitting device 150 have different emission colors.

Accordingly, light-emitting devices with different emission colors can be manufactured using EL layers formed using the same apparatus and condition.

In addition, when in a manufacture line for light-emitting devices with one emission color, a small number of light-emitting devices with a different emission color are needed, the both devices can be manufactured on the same manufacture line (that is, mixed production); therefore, light-emitting devices can be manufactured at low cost even in the case of low-volume production.

Note that in this embodiment, a top emission type structure in which light from the first EL layer 110 and light from the second EL layer 130 are emitted on the side opposite to the substrates over which the EL layers are formed as illustrated in FIGS. 1A to 1C is described; however, bottom emission type light-emitting devices in which light is emitted to the substrate side over which the EL layers are formed as illustrated in FIGS. 4A to 4C may be provided.

FIGS. 4A to 4C illustrate structures of a third light-emitting device 440 and a fourth light-emitting device 450 which are examples of a bottom emission type light-emitting device. FIG. 4A is a top view of the third light-emitting device 440 which is one of two light-emitting devices manufactured by the method described in this embodiment. Note that the third light-emitting device 440 and the fourth light-emitting device 450 have the same mode when seen from the above; therefore, FIG. 4A is also used for description of a top view of the fourth light-emitting device 450 and reference numerals shown in parentheses represent components used for the fourth light-emitting device 450. In the top view in FIG. 4A, in order to clarify the structure, only a film and layer on which pattern formation is performed are illustrated and a substrate which is formed on the uppermost surface is not illustrated. Further, FIG. 4B is a schematic cross-sectional view of the third light-emitting device 440 taken along dashed-dotted lines C1-C2 and D1-D2 in FIG. 4A. FIG. 4C is a schematic cross-sectional view of the fourth light-emitting device 450 taken along dashed-dotted lines C1-C2 and D1-D2 in FIG. 4A.

The third light-emitting device 440 and the fourth light-emitting device 450 are described below with reference to FIGS. 4B and 4C. Note that in FIGS. 4A to 4C and in the following description, components (e.g., the first substrate 100 and the first base layer 102) having the same portions or portions having similar functions in the above description are denoted by the same reference numerals, and the description thereof will not be repeated.

The third light-emitting device 440 includes, as illustrated in FIG. 4B; the first base layer 102 formed over the second substrate 116, the first transparent conductive layer 106 formed over the first base layer 102, the first insulating layer 108 formed over the first transparent conductive layer 106, the first EL layer 110 formed over the first transparent conductive layer 106 and the first insulating layer 108, a first reflective layer 412 having conductivity which covers the first EL layer 110 and part of which is formed on an outer side of the first sealant 114, the first sealant 114 formed so as to surround the first EL layer 110 over the second substrate 116, and the first substrate 100 which is bonded to the second substrate 116 with the first sealant 114. Light emitted from the first EL layer 110 is extracted to the second substrate 116 side (in a direction indicated by a white arrow in the drawing).

Thus, an interference of light is increased, so that an emission color of the first light-emitting device 140 can be largely changed depending on the length of the first optical path length 142. Further, the same can be said for the second light-emitting device 150.

For example, layers in which an alloy of magnesium and silver (Mg—Ag) with a thickness of 10 nm is formed over the first EL layer 110 and the second EL layer 130 by a resistance heating evaporation method, ITO with a thickness of 50 nm is formed by a mirrortron sputtering method, and then pattern formation treatment is performed as appropriate may be used as the first conductive layer 112 and the second conductive layer 132.

Note that the first conductive layer 112 and the second conductive layer 132 are preferably formed using the same apparatus and condition. Thus, a step of forming the first EL layer 110 and the first conductive layer 112 in this order over the first base substrate 148 and a step of forming the second EL layer 130 and the second conductive layer 132 in this order over the second base substrate 149 can be performed at a time using the same apparatus and condition. Therefore, light-emitting devices with different emission colors can be formed more easily.

Next, the first sealant 114 is formed over the first substrate 100 so as to surround the first EL layer 110 and the second sealant 134 is formed over the third substrate 120 so as to surround the second EL layer 130. Then, the second substrate 116 is bonded onto the first substrate 100, and the fourth substrate 136 is bonded onto the third substrate 120 (see FIG. 3C).

The first sealant 114 and the second sealant 134 respectively have functions of suppressing deterioration caused by entry of moisture or oxygen from the outside to the first EL layer 110 and the second EL layer 130, and may be formed by a printing method using any of the following machines: a flexible printing machine, an offset printing machine, a gravure printing machine, a screen printing machine, an inkjet machine, a dispenser, and the like.

The fourth light-emitting device 450 includes, as illustrated in FIG. 4C, the second base layer 122 formed over the fourth substrate 136, the second transparent conductive layer 126 formed over the second base layer 122, the second insulating layer 128 formed over the second transparent conductive layer 126, the second EL layer 130 formed over the second transparent conductive layer 126 and the second insulating layer 128, a second reflective layer 432 having conductivity which covers the second EL layer 130 and part of which is formed on an outer side of the second sealant 134, the second sealant 134 formed so as to surround the second EL layer 130 over the fourth substrate 136, and the third substrate 120 which is bonded to the fourth substrate 136 with the second sealant 134. Light emitted from the second EL layer 130 is extracted to the fourth substrate 136 side (in a direction indicated by a white arrow in the drawing).

The first reflective layer 412 having conductivity and the second reflective layer 432 having conductivity are layers for reflecting light from the EL layers, similarly to the first reflective layer 104 and the second reflective layer 124. Therefore, the first reflective layer 412 having conductivity and the second reflective layer 432 having conductivity may be basically formed using a formation method and a material similar to those of the first reflective layer 104 and the second reflective layer 124. However, since each of them serves as one of electrodes between which the EL layer is sandwiched, materials preferably have a low resistance value. Specifically, a material with a resistivity of less than or equal to $1.0 \times 10^{-3}$ [Ω·cm] is preferable, and a material with a resistivity of less than or equal to $2.0 \times 10^{-4}$ [Ω·cm] is more preferable.

In the third light-emitting device 440, light from the first EL layer 110 is emitted toward the lower side; thus, the positions of the first substrate 100 and the second substrate 116 are reversed as compared to the first light-emitting device 140. In the fourth light-emitting device 450, light from the second EL layer 130 is emitted toward the lower side; thus, the positions of the third substrate 120 and the fourth substrate 136 are reversed as compared to the second light-emitting device 150. Note that the first EL layer 110 and the second EL layer 130 may have an inversely stacked structure.

With the use of the bottom emission type light-emitting device, no adverse effect is given on its light-emitting state even when a light-shielding substance such as an absorbent is provided in a space portion 418 of the third light-emitting device 440 or a space portion 438 of the fourth light-emitting device 450. In addition, the first substrate 100 and the second substrate 120 each do not need to have a light-transmitting property; therefore, any of a variety of substrates having a low moisture permeability (e.g., a light-shielding substrate such as a metal substrate) can be used. As a result, light-emitting devices in which deterioration of the first EL layer 110 and the second EL layer 130 due to moisture, oxygen, or the like which enters from the outside is suppressed can be manufactured.

(Embodiment 2)

In this embodiment, a light-emitting device which is manufactured using a base substrate which is different from the base substrates in Embodiment 1 and a manufacturing method thereof are described with reference to FIGS. 5A and 5B, FIGS. 6A to 6C, FIGS. 7A to 7D, and FIGS. 8A and 8B. In the structure of this embodiment described below, the same portions or portions having similar functions are denoted by the same reference numerals in different drawings, in Embodiment 1, and the description thereof is not repeated.

<Structure of Light-Emitting Device in this Embodiment>

Figure 5A:
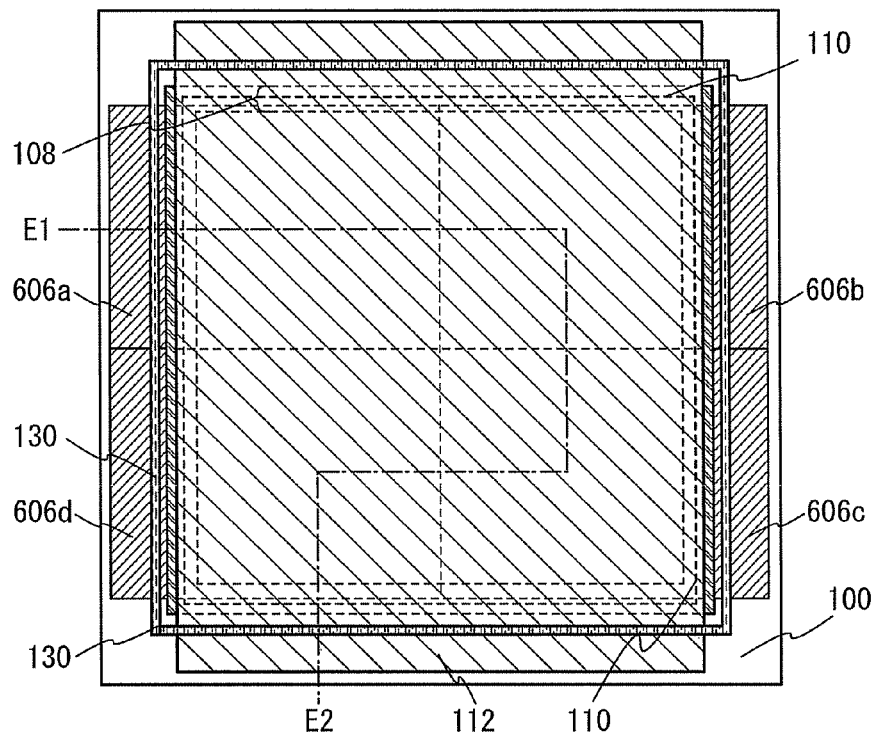
FIGS. 5A and 5B illustrate a structure of a light-emitting device described in Embodiment 2.
Figure 5B:
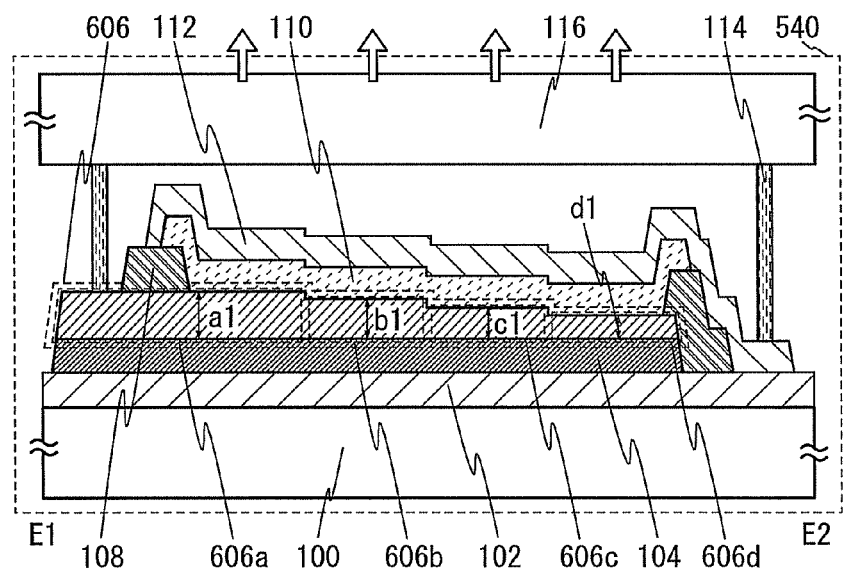

FIGS. 5A and 5B are a structural example of a light-emitting device manufactured by a method described in this embodiment, and FIG. 5A is a top view of a fifth light-emitting device 540 which is one embodiment of a light-emitting device by a method described in this embodiment. In the top view in FIG. 5A, in order to clarify the structure, only a film and layer on which pattern formation is performed are illustrated and a substrate which is formed on the uppermost surface is not illustrated.

FIG. 5B is a schematic cross-sectional view of the fifth light-emitting device 540 taken along dashed-dotted line E1-E2 in FIG. 5A. The fifth light-emitting device 540 in FIG. 5B has a structure in which a transparent conductive layer with partly different thicknesses (hereinafter, abbreviated to a third transparent conductive layer 606) is used instead of the first transparent conductive layer 106 of the first light-emitting device 140 described in Embodiment 1. As a transparent conductive layer with partly different thicknesses, the third transparent conductive layer 606 including four regions (a region 606a with a thickness a1, a region 606b with a thickness b1, a region 606c with a thickness c1, and a region 606d with a thickness d1) is used in this embodiment. It is needless to say that the transparent conductive layer is not limited to such a structure. Note that similarly to Embodiment 1, the first EL layer 110 is formed using the same apparatus and condition and is a uniform layer (can be referred to as a layer having the same composition) on the entire surface.

<Method for Manufacturing Light-Emitting Device in this Embodiment>

Figure 6A:
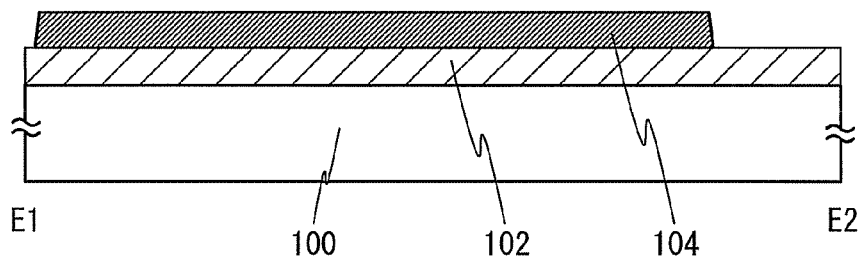
FIGS. 6A to 6C illustrate a method for manufacturing a light-emitting device described in Embodiment 2.

First, in a manner similar to that in Embodiment 1, the first base layer 102 and the first reflective layer 104 are formed in this order over the first substrate 100 (see FIG. 6A).

Figure 6B:
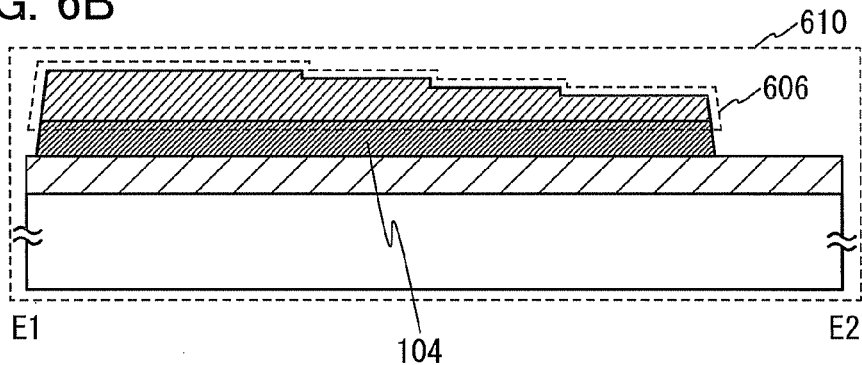

Next, the third transparent conductive layer 606 is formed over the first reflective layer 104 (see FIG. 6B).

The third transparent conductive layer 606 is formed using a material similar to those of the first transparent conductive layer 106 and the second transparent conductive layer 126 by a known method, e.g., a CVD method such as a plasma CVD method, a PVD method, or a sputtering method. In this embodiment, the case where the third transparent conductive layer 606 includes the four regions 606a, 606b, 606c, and 606d with different thicknesses is described.

Figure 7A:
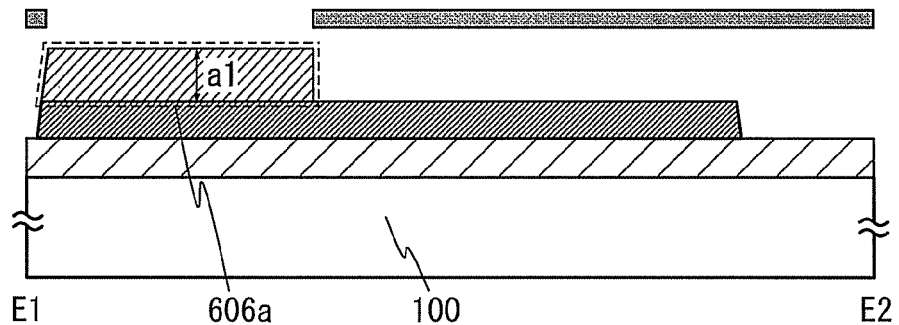
FIGS. 7A to 7D illustrate a method for manufacturing a light-emitting device described in Embodiment 2.
Figure 7B:
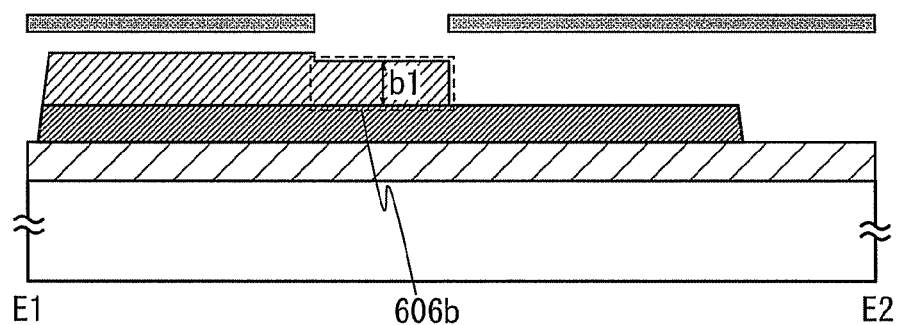
Figure 7C:
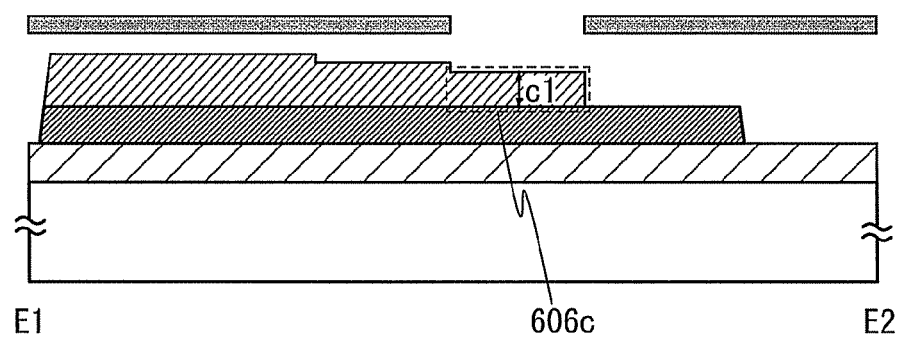
Figure 7D:
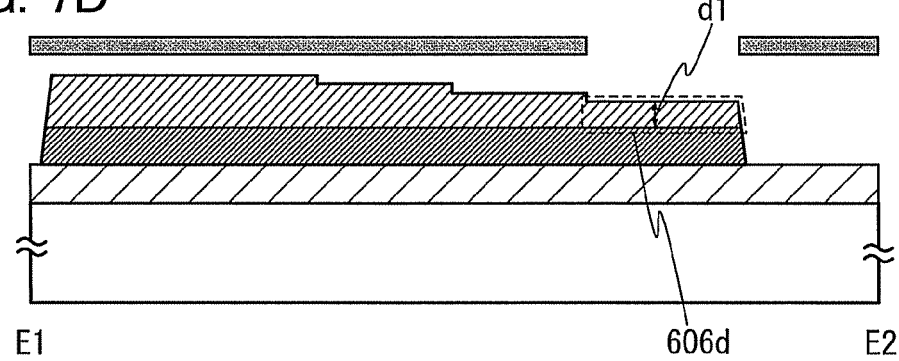

As a method for forming the third transparent conductive layer 606, as illustrated in FIGS. 7A to 7D, a transparent conductive layer with the thickness a1 is formed in a state where the first substrate 100 is covered with a mask having an opening in a region where the region 606a is to be formed, so that the region 606a is formed (see FIG. 7A). After that, the same applies to the regions 606b, 606c, and 606d, and transparent conductive layers with required thicknesses (the regions 606b, 606c, and 606d respectively have the thicknesses b1, c1, and d1.) are formed using masks each having an opening in a region where the transparent conductive layer is to be formed, so that the regions 606b, 606c, and 606d are formed (see FIGS. 7B to 7D). Thus, as illustrated in FIG. 6B, the third transparent conductive layer 606 including four regions (606a, 606b, 606c, and 606d) with different thicknesses can be formed. Needless to say, a method for forming the third transparent conductive layer 606 is not limited to the above method, and any method can be used as long as regions with different thicknesses can be formed.

The number of regions with different thicknesses is four in this embodiment; however, there is no particular limitation on the number of regions as long as the number of regions is two or more.

Through the above steps, a third base substrate 610 is prepared in which the first base layer 102, the first reflective layer 104, and the third transparent conductive layer 606 formed to partly have a different thickness are formed in this order over the first substrate 100.

Figure 6C:
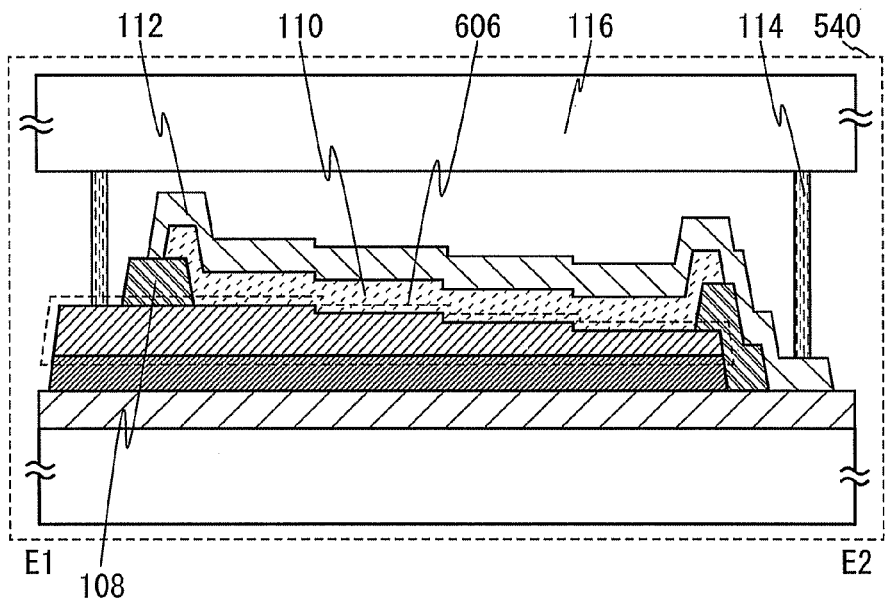

As for the following steps, in a manner similar to those in Embodiment 1, the first insulating layer 108, the first EL layer 110, and the first conductive layer 112 are formed over the third base substrate 610 and the first substrate 100 and the second substrate 116 are bonded to each other with the first sealant 114, so that the fifth light-emitting device 540 is formed (see FIG. 6C).

<Effect of Light-Emitting Device Manufactured in this Embodiment>

The steps of manufacturing the fifth light-emitting device 540 of this embodiment, which are subsequent to the preparation of the third base substrate 610, are similar to the steps of manufacturing the first light-emitting device 140 and the second light-emitting device 150 of Embodiment 1, which are subsequent to the preparation of the first base substrate 148 and the second base substrate 149, as described above; therefore, the first light-emitting device 140 with one emission color and the fifth light-emitting device 540 with four emission colors can be manufactured using EL layers formed using the same apparatus and condition, for example, in the following manner: the first base substrate 148 described in Embodiment 1 and the third base substrate 610 described in this embodiment are prepared; the first insulating layer 108, the first EL layer 110, and the first conductive layer 112 are formed over each of the base substrates; and the first substrate 100 and the second substrate 116 are bonded to each other with the first sealant 114.

In the third base substrate 610, the thickness of the third transparent conductive layer 606 decreases in the order of the top left (the thickness a1), top right (the thickness b1), bottom right (the thickness c1), and bottom left (the thickness d1). The third base substrate 610 and a base substrate which is different from the third base substrate 610 (e.g., a base substrate including a transparent conductive layer whose thickness decreases in the order of the top right (the thickness a1), top left (the thickness b1), bottom left (the thickness c1), and bottom right (the thickness d1)) are prepared, the first insulating layer 108, the first EL layer 110, and the first conductive layer 112 are formed over each of the base substrates, and the first substrate 100 and the second substrate 116 are bonded to each other with the first sealant 114, whereby light-emitting devices with four emission colors having different light emission patterns can be manufactured using EL layers formed using the same apparatus and condition.

The fifth light-emitting device 540 can emit a plurality of lights of different colors (e.g., lights of four different emission colors by the method described in this embodiment); therefore, a light-emitting device with high added value, e.g., light emitted to the outside can be a mosaic pattern, can be obtained.

Figure 8A:
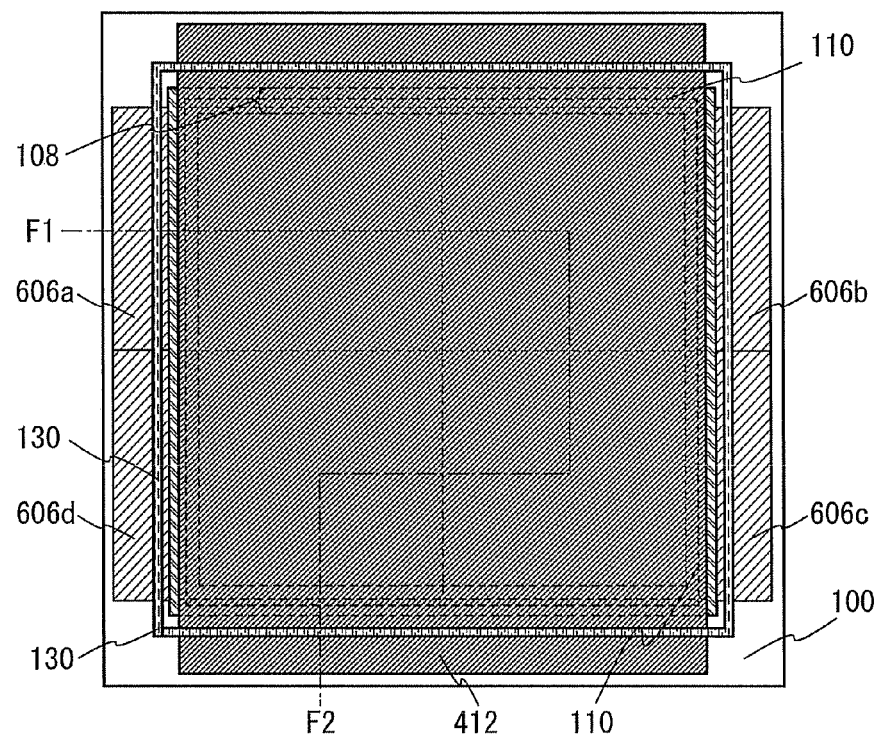
FIGS. 8A and 8B illustrate a structure of a light-emitting device described in Embodiment 2.
Figure 8B:
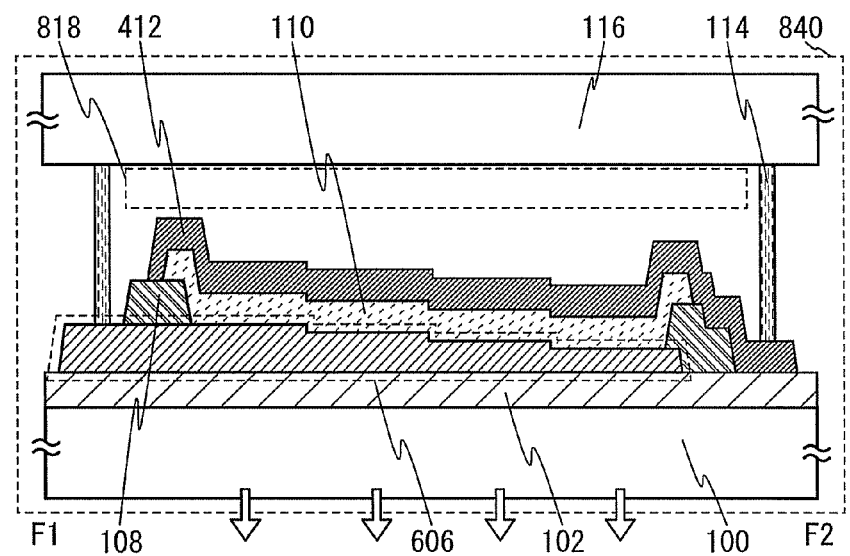

In this embodiment, the case where light emitted from the first EL layer 110 has a top emission structure in which light is emitted from the side opposite to a substrate over which the EL layer is formed as illustrated in FIGS. 5A and 5B is described; however, a bottom emission structure like the structure of a sixth light-emitting device 840 (see FIGS. 8A and 8B; FIG. 8A is a top view and FIG. 8B is a cross-sectional view taken along dashed-dotted line F1-F2 in FIG. 8A.) may be used. The sixth light-emitting device 840 in FIGS. 8A and 8B has a structure in which the third transparent conductive layer 606 described in this embodiment is provided instead of the first transparent conductive layer 106 of the third light-emitting device 440 in FIGS. 4A to 4C described in Embodiment 1; therefore, materials and formation methods of components may be referred to for those in Embodiment 1 and this embodiment.

With the use of the bottom emission type light-emitting device, no adverse effect is given on its light-emitting state even when a light-shielding substance such as an absorbent is provided in a space portion 818 of the sixth light-emitting device 840. In addition, the first substrate 100 does not need to have a light-transmitting property; therefore, any of a variety of substrates having a low moisture permeability (e.g., a light-shielding substrate such as a metal substrate) can be used. As a result, a light-emitting device in which deterioration of the EL layer due to moisture, oxygen, or the like which enters from the outside is suppressed can be manufactured.

In this embodiment, as "a transparent conductive layer with a partly different thickness", a transparent conductive layer including a plurality of regions with different thicknesses is used as illustrated in FIGS. 5A and 5B; however, a transparent conductive layer including a region with a continuously changed thickness may be used.

Figure 9A:
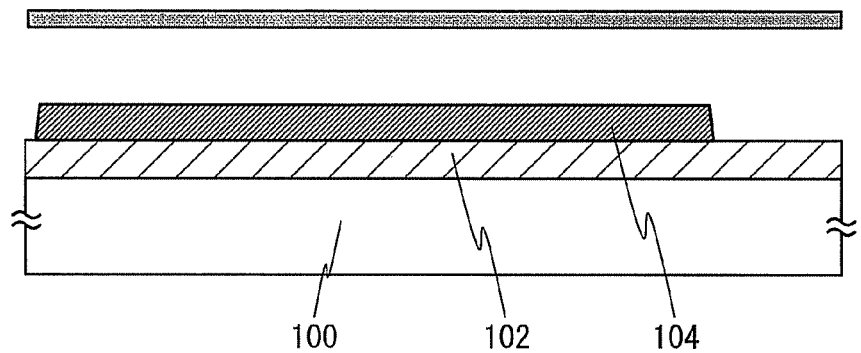
FIGS. 9A to 9C illustrate a method for manufacturing a light-emitting device described in Embodiment 2.
Figure 9B:
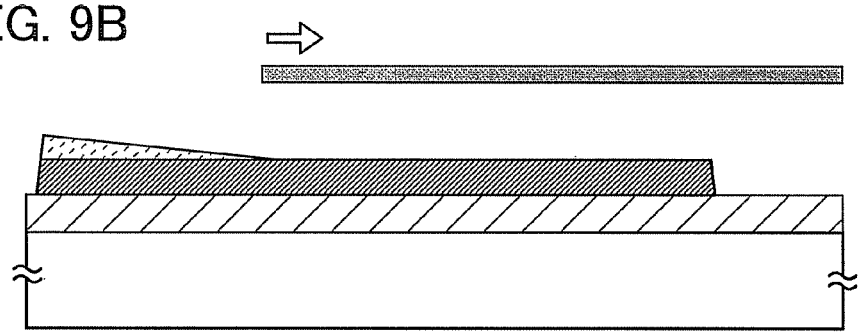
Figure 9C:
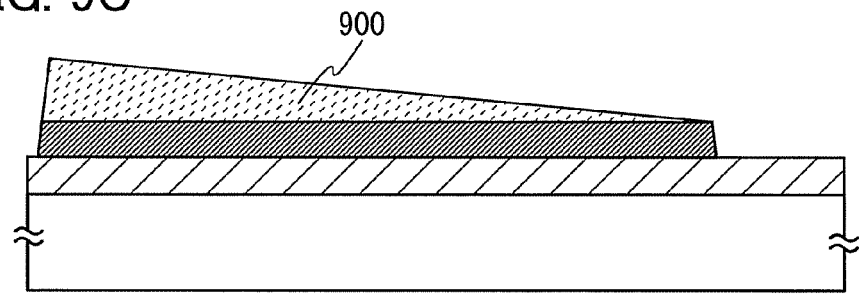

As a method for forming such a layer, e.g., as illustrated in FIGS. 9A to 9C, the first substrate 100 in which the first base layer 102 and the first reflective layer 104 are formed in this order is prepared as in FIG. 6A and formation of a transparent conductive layer is started in a state where the entire surface of the first substrate 100 is covered with a mask (see FIG. 9A). After that, the mask is moved little by little so that a transparent conductive layer is formed little by little from the end of the substrate (see FIG. 9B). By such a method, as illustrated in FIG. 9C, a transparent conductive layer 900 including a region with a continuously changed thickness can be formed.

With the use of the above-described transparent conductive layer including a region with a continuously changed thickness, a light-emitting device with high added value, e.g., light emitted to the outside can have gradation, can be obtained.
(Embodiment 3)

In this embodiment, examples of the first EL layer 110 and the second EL layer 130 which can be applied to one embodiment of the present invention are described with reference to FIGS. 10A to 10C. Since the first EL layer 110 and the second EL layer 130 are the same layers formed using the same apparatus and condition, only the first EL layer 110 is described in this embodiment.

The first EL layer 110 includes at least a light-emitting layer containing a light-emitting organic compound. In addition, the first EL layer 110 can have a stacked-layer structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like are combined as appropriate. The first EL layer 110 in FIG. 10A includes a hole-injection layer 701, a hole-transport layer 702, a light-emitting layer 703, an electron-transport layer 704, and an electron-injection layer 705 and is sandwiched between layers serving as electrodes. Note that the stacking order may be inversed. In this embodiment, the first transparent conductive layer 106 and the first conductive layer 112 described in Embodiment 1 are written as the layers serving as the electrodes in the drawings; however, the layers serving as the electrodes are not limited thereto and are changed depending on the structure of a light-emitting device. For example, in the third light-emitting device 440 of a bottom emission type illustrated in FIGS. 4A to 4C, the first transparent conductive layer 106 and the first reflective layer 412 having conductivity are the layers serving as the electrodes.

A method for manufacturing the light-emitting element illustrated in FIG. 10A will be described.

First, the hole injection layer 701 is formed. The hole injection layer 701 is a layer containing a substance having a high hole injection property. As the substance having a high hole injection property, for example, a metal oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide can be used. A phthalocyanine-based compound such as phthalocyanine (abbreviation: H$_2$Pc) or copper(II)phthalocyanine (abbreviation: CuPc) may be used.

Further, any of the following aromatic amine compounds which are low molecular organic compounds can be used: 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Still alternatively, any of high molecular compounds (e.g., oligomers, dendrimers, or polymers) may be used. Examples of the high molecular compound include poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylmide] (abbreviation: PTPDMA), and poly[N,N'-bis(4-butylphenyl)-N,N'-bis(phenyl)benzidine](abbreviation: Poly-TPD). A high molecular compound to which acid is added, such as poly(3,4-ethylenedioxythiophene)/poly(styrenesulfonic acid) (PEDOT/PSS) or polyaniline/poly(styrenesulfonic acid) (PAni/PSS), may be used.

In particular, for the hole injection layer 701, a composite material in which an organic compound having a high hole transport property is mixed with an acceptor substance is preferably used. With the use of the composite material in which a substance having a high hole transport property is mixed with an acceptor substance, excellent hole injection from the first transparent conductive layer 106 can be obtained, which results in a reduction in driving voltage of the light-emitting element. Such a composite material can be formed by co-evaporation of a substance having a high hole transport property and an acceptor substance. The hole injection layer 701 is formed using the composite material, whereby hole injection from the first transparent conductive layer 106 to the first EL layer 110 is facilitated.

As the organic compound for the composite material, any of a variety of compounds such as aromatic amine compounds, carbazole derivatives, aromatic hydrocarbons, and high molecular compounds (e.g., oligomers, dendrimers, and polymers) can be used. The organic compound used for the composite material is preferably an organic compound having a high hole transport property. Specifically, a substance having a hole mobility of $10^{-6}$ cm$^2$/Vs or higher is preferably used. Note that any other substance may be used as long as the hole transport property thereof is higher than the electron transport property thereof. Specific examples of the organic compound that can be used for the composite material are given below.

Examples of the organic compound that can be used for the composite material include aromatic amine compounds such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP), and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl]-2,3,5,6-tetraphenylbenzene.

Further, any of the following aromatic hydrocarbon compounds may be used: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di (2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, and the like.

Furthermore, any of the following aromatic hydrocarbon compounds may be used: 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Examples of the electron acceptor include organic compounds such as 7,7,8,8-tetracyano-2,3,5,6-tetrafluoroquinodimethane (abbreviation: $F_4$-TCNQ) and chloranil; and transition metal oxides. Other examples include oxides of metals belonging to Groups 4 to 8 in the periodic table. Specifically, vanadium oxide, niobium oxide, tantalum oxide, chromium oxide, molybdenum oxide, tungsten oxide, manganese oxide, and rhenium oxide are preferable because of their high electron accepting property. Among these, molybdenum oxide is particularly preferable because it is stable in the air, has a low hygroscopic property, and is easily handled.

The composite material may be formed using the above electron acceptor and the above high molecular compound such as PVK, PVTPA, PTPDMA, or Poly-TPD and used for the hole injection layer 701.

Next, the hole transport layer 702 is formed over the hole injection layer 701. The hole transport layer 702 is a layer containing a substance having a high hole transport property. As the substance having a high hole transport property, any of the following aromatic amine compounds can be used, for example: NPB, TPD, BPAFLP, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances given here are mainly ones that have a hole mobility of $10^{-6}$ cm$^2$/Vs or higher. Note that any other substance may be used as long as the hole transport property thereof is higher than the electron transport property thereof. Note that the layer containing a substance having a high hole transport property is not limited to a single layer and may be formed of a stack of two or more layers containing any of the above substances.

For the hole transport layer 702, a carbazole derivative such as CBP, CzPA, or PCzPA or an anthracene derivative such as t-BuDNA, DNA, or DPAnth may be used.

For the hole transport layer 702, a high molecular compound such as PVK, PVTPA, PTPDMA, or Poly-TPD may be used.

Next, the light-emitting layer 703 is formed over the hole transport layer 702. The light-emitting layer 703 is a layer containing a light-emitting organic compound. As the light-emitting organic compound, for example, a fluorescent compound that exhibits fluorescence or a phosphorescent compound that exhibits phosphorescence can be used.

The fluorescent compounds that can be used for the light-emitting layer 703 will be given. Examples of a material for blue light emission include N,N'-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), and 4-(10-phenyl-9-anthryl)-4'-(9-phenyl-9H-carbazol-3-yl)triphenylamine (abbreviation: PCBAPA). Further, examples of a material for green light emission include N-(9,10-diphenyl-2-anthryl)-N, 9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), and N,N,9-triphenylanthracen-9-amine (abbreviation: DPhAPhA). Examples of a material for yellow light emission include rubrene and 5,12-bis(1,1'-biphenyl-4-yl)-6,11-diphenyltetracene (abbreviation: BPT). Examples of a material for red light emission include N,N,N',N'-tetrakis(4-methylphenyl)tetracene-5,11-diamine (abbreviation: p-mPhTD), and 7,14-diphenyl-N,N,N',N'-tetrakis(4-methylphenyl)acenaphtho[1,2-α]fluoranthene-3,10-d iamine (abbreviation: p-mPhAFD).

The phosphorescent compounds that can be used for the light-emitting layer 703 will be given. Examples of a material for blue light emission include bis[2-(4',6'-difluorophenyl)pyridinato-N,C$^{2'}$]iridium(III)tetrakis(1-pyrazolyl)borate (abbreviation: FIr6), bis[2-(4',6'-difluorophenyl)pyridinato-N,C$^{2'}$]iridium(III)picolinate (abbreviation: FIrpic), bis{2-[3',5'-bis(trifluoromethyl)phenyl]pyridinato-N,C$^{2'}$}iridium(III) picolinate (abbreviation: Ir(CF$_3$ppy)$_2$(pic)), and bis[2-(4',6'-difluorophenyl)pyridinato-N,C$^{2'}$]iridium(III)acetylacetonate (abbreviation: FIr(acac)). Examples of a material for green light emission include tris(2-phenylpyridinato-N,C$^{2'}$)iridium (III) (abbreviation: Ir(ppy)$_3$), bis(2-phenylpyridinato-N,C$^{2'}$)iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), and tris(benzo[h]quinolinato)iridium(III) (abbreviation: Ir(bzq)$_3$). Examples of a material for yellow light emission include bis(2,4-diphenyl-1,3-oxazolato-N,C$^{2'}$)iridium(III)acetylacetonate (abbreviation: Ir(dpo)$_2$(acac)), bis[2-(4'-perfluorophenylphenyl)pyridinato]iridium(III) acetylacetonate (abbreviation: Ir(p-PF-ph)$_2$(acac)), bis(2-phenylbenzothiazolato-N,C$^{2'}$)iridium(III)acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), and (acetylacetonato)bis{2-(4-methoxyphenyl)-3,5-dimethylpyrazinato}iridium(III) (abbreviation: Ir(dmmoppr)$_2$(acac)). Examples of a material for orange light emission include tris(2-phenylquinolinato-N,C$^{2'}$)iridium(III) (abbreviation: Ir(pq)$_3$), bis(2-phenylquinolinato-N,C$^{2'}$)iridium(III)acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), and (acetylacetonato)bis(5-isopropyl-3-methyl-2-phenylpyrazinato)iridium(III) (abbreviation: Ir(mppr-iPr)$_2$(acac)). Examples of a material for red light emission include organometallic complexes such as bis[2-(2'-benzo[4,5-α]thienyl)pyridinato-N,C$^{3'}$]iridium(III)acetylacetonate (abbreviation: Ir(btp)$_2$(acac)), bis(1-phenylisoquinolinato-N,C$^{2'}$)iridium(III)acetylacetonate (abbreviation: Ir(piq)$_2$(acac)), (acetylacetonato)bis[2,3-bis(4-fluorophenyl)quinoxalinato]

iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (dipivaloylmethanato)bis(2,3,5-triphenylpyrazinato)iridium(III) (abbreviation: Ir(tppr)$_2$(dpm)), and 2,3,7,8,12,13,17,18-octaethyl-21H,23H-porphyrinplatinum(II) (abbreviation: PtOEP). Further, rare-earth metal complexes, such as tris(acetylacetonato)(monophenanthroline)terbium(III) (abbreviation: Tb(acac)$_3$(Phen)), tris(1,3-diphenyl-1,3-propanedionato)(monophenanthroline)europium(I) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)), exhibit light emission from rare-earth metal ions (electron transition between different multiplicities), and thus can be used as phosphorescent compounds.

Note that the light-emitting layer 703 may have a structure in which the above light-emitting organic compound (a guest material) is dispersed in another substance (a host material). As a host material, a variety of kinds of materials can be used, and it is preferable to use a substance which has a lowest unoccupied molecular orbital level (LUMO level) higher than that of the light-emitting material and has a highest occupied molecular orbital level (HOMO level) lower than that of the light-emitting material.

Specific examples of the host material include metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), bathophenanthroline (abbreviation: BPhen), and bathocuproine (abbreviation: BCP); condensed aromatic compounds such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3), 9,10-diphenylanthracene (abbreviation: DPAnth), and 6,12-dimethoxy-5,11-diphenylchrysene; and aromatic amine compounds such as N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or c-NPD), TPD, DFLDPBi, and BSPB.

As the host material, plural kinds of materials can be used. For example, in order to suppress crystallization, a substance such as rubrene which suppresses crystallization may be further added. In addition, NPB, Alq, or the like may be further added in order to efficiently transfer energy to a guest material.

When a structure in which a guest material is dispersed in a host material is employed, crystallization of the light-emitting layer 703 can be suppressed. Further, concentration quenching due to high concentration of the guest material can be suppressed.

For the light-emitting layer 703, a high molecular compound can be used. Specifically, a material for blue light emission, a material for green light emission, and a material for orange to red light emission are given. Examples of a material for blue light emission include poly(9,9-dioctylfluorene-2,7-diyl) (abbreviation: PFO), poly[(9,9-dioctylfluorene-2,7-diyl-co-(2,5-dimethoxybenzene-1,4-diyl)](abbreviation: PF-DMOP), and poly{(9,9-dioctylfluorene-2,7-diyl)-co-[N,N'-di-(p-butylphenyl)-1,4-diaminobenzene]} (abbreviation: TAB-PFH). Examples of a material for green light emission include poly(p-phenylenevinylene) (abbreviation: PPV), poly[(9,9-dihexylfluorene-2,7-diyl)-alt-co-(benzo[2,1,3]thiadiazole-4,7-diyl)](abbreviation: PFBT), and poly[(9,9-dioctyl-2,7-divinylenfluorenylene)-alt-co-(2-methoxy-5-(2-ethylhexyloxy)-1,4-phenylene)]. Examples of a material for orange to red light emission include poly[2-methoxy-5-(2'-ethylhexoxy)-1,4-phenylenevinylene](abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenyl amino)-1,4-phenylene]}, and poly{[2-methoxy-5-(2-ethylhexyloxy)-1,4-bis(1-cyanovinylenephenylene)]-alt-co-[2,5-bis(N,N'-diphenylamino)-1,4-phenylene]}(abbreviation: CN-PPV-DPD).

Next, the electron transport layer 704 is formed over the light-emitting layer 703. The electron transport layer 704 is a layer containing a substance having a high electron transport property. As the substance having a high electron transport property, any of the following can be used, for example: metal complexes having a quinoline skeleton or a benzoquinoline skeleton, such as Alq, Almq$_3$, BeBq$_2$, and BAlq. Alternatively, a metal complex or the like including an oxazole-based or thiazole-based ligand, such as ZnPBO or ZnBTZ, can be used. Other than the metal complexes, PBD, OXD-7, TAZ, BPhen, BCP, or the like may be used. The substances mentioned here are mainly ones that have an electron mobility of $10^6$ cm$^2$/V·s or higher. The electron transport layer is not necessarily a single layer and may be formed of a stack including two or more layers containing any of above substances.

Next, the electron injection layer 705 is formed over the electron transport layer 704. The electron injection layer 705 is a layer containing a substance having a high electron injection property. For the electron injection layer 705, an alkali metal, an alkaline earth metal, or a compound thereof, such as lithium, cesium, calcium, lithium fluoride, cesium fluoride, calcium fluoride, or lithium oxide, can be used. Further, a rare earth metal compound such as erbium fluoride may be used. A substance for forming the electron transport layer 704 may be used.

Note that the hole injection layer 701, the hole transport layer 702, the light-emitting layer 703, the electron transport layer 704, and the electron injection layer 705 which are described above can each be formed by an evaporation method (e.g., a vacuum evaporation method), an inkjet method, a coating method, or the like.

Figure 10A:
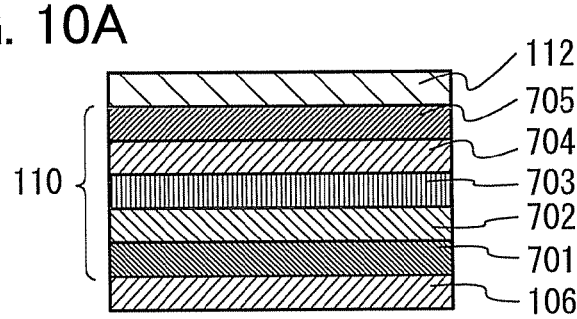
FIGS. 10A to 10C illustrate EL layers.

Through the above steps, the first EL layer 110 illustrated in FIG. 10A can be formed.

Figure 10B:
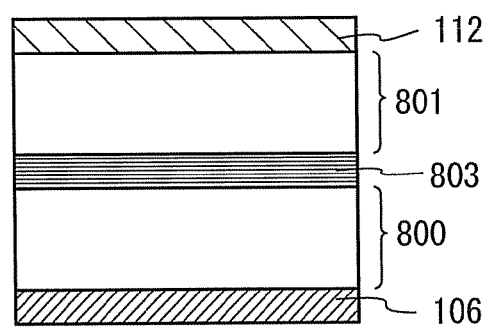

As illustrated in FIG. 10B, a plurality of first EL layers 110 may be stacked between the first transparent conductive layer 106 and the first conductive layer 112. In that case, a charge generation layer 803 is preferably provided between an EL layer 800 and an EL layer 801 which are stacked in this order. The charge generation layer 803 can be formed by using the above-mentioned composite material. Further, the charge generation layer 803 may have a stacked structure including a layer containing the composite material and a layer containing another material. In that case, as the layer containing another material, a layer containing an electron donating substance and a substance having a high electron transport property, a layer formed of a transparent conductive film, or the like can be used. As for a light-emitting element having such a structure, problems such as energy transfer and quenching are less likely to occur, and thus a light-emitting element which has both high emission efficiency and long lifetime can be easily obtained due to expansion in the choice of materials. Moreover, a light-emitting element which provides phosphorescence from one of the EL layers and fluorescence from the other can be readily obtained. Note that this structure can be combined with any of the above structures of the EL layer.

Figure 10C:
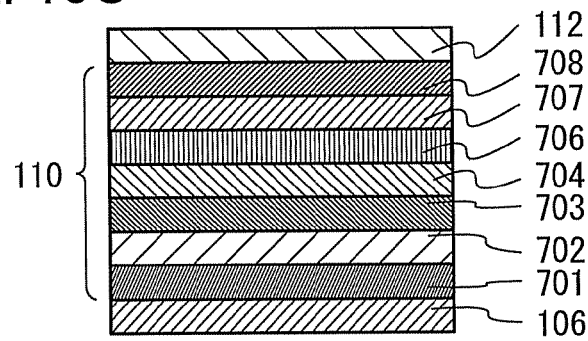

As illustrated in FIG. 10C, the first EL layer 110 may include the hole injection layer 701, the hole transport layer 702, the light-emitting layer 703, the electron transport layer 704, an electron injection buffer layer 706, an electron relay layer 707, and a composite material layer 708, between the first transparent conductive layer 106 and the first conductive layer 112.

It is preferable to provide the composite material layer 708, in which case damage caused to the first EL layer 110 particularly when the first conductive layer 112 is formed by a sputtering method can be reduced. The composite material layer 708 can be formed using the above composite material in which an organic compound having a high hole transport property is mixed with an acceptor substance.

Further, by providing the electron injection buffer layer 706, an injection barrier between the composite material layer 708 and the electron transport layer 704 can be reduced; thus, electrons generated in the composite material layer 708 can be easily injected to the electron transport layer 704.

Any of the following substances having a high electron injection property can be used for the electron injection buffer layer 706: an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and a carbonate), a rare earth metal compound (e.g., an oxide, a halide, and a carbonate)), and the like.

Further, in the case where the electron injection buffer layer 706 contains a substance having a high electron transport property and a donor substance, the donor substance is preferably added so that the mass ratio of the donor substance to the substance having a high electron transport property is from 0.001:1 to 0.1:1. Note that as the donor substance, an organic compound such as tetrathianaphthacene (abbreviation: TTN), nickelocene, or decamethylnickelocene may be used as well as an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and a carbonate), and a rare earth metal compound (e.g., an oxide, a halide, and a carbonate)). Note that as the substance having a high electron transport property, a material similar to the material for the electron transport layer 704 described above can be used.

Furthermore, the electron relay layer 707 is preferably formed between the electron injection buffer layer 706 and the composite material layer 708. The electron relay layer 707 is not necessarily provided; however, by providing the electron relay layer 707 having a high electron transport property, electrons can be rapidly transported to the electron injection buffer layer 706.

The structure in which the electron relay layer 707 is sandwiched between the composite material layer 708 and the electron injection buffer layer 706 is a structure in which the acceptor substance contained in the composite material layer 708 and the donor substance contained in the electron injection buffer layer 706 are less likely to interact with each other, and thus their functions hardly interfere with each other. Accordingly, an increase in driving voltage can be prevented.

The electron relay layer 707 contains a substance having a high electron transport property and is formed so that the LUMO level of the substance having a high electron transport property is located between the LUMO level of the acceptor substance contained in the composite material layer 708 and the LUMO level of the substance having a high electron transport property contained in the electron transport layer 704. In the case where the electron relay layer 707 contains a donor substance, the donor level of the donor substance is controlled so as to be located between the LUMO level of the acceptor substance in the composite material layer 708 and the LUMO level of the substance having a high electron transport property contained in the electron transport layer 704. As a specific value of the energy level, the LUMO level of the substance having a high electron transport property contained in the electron relay layer 707 is preferably greater than or equal to −5.0 eV, more preferably greater than or equal to −5.0 eV and less than or equal to −3.0 eV.

As the substance having a high electron transport property contained in the electron relay layer 707, a phthalocyanine-based material or a metal complex having a metal-oxygen bond and an aromatic ligand is preferably used.

As the phthalocyanine-based material contained in the electron relay layer 707, specifically, any of the following is preferably used: CuPc, a phthalocyanine tin(II) complex (SnPc), a phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc).

As the metal complex having a metal-oxygen bond and an aromatic ligand, which is contained in the electron relay layer 707, a metal complex having a metal-oxygen double bond is preferably used. The metal-oxygen double bond has an acceptor property (a property of easily accepting electrons); thus, electrons can be transferred (donated and accepted) more easily. Further, the metal complex which has a metal-oxygen double bond is considered stable. Thus, the use of the metal complex having a metal-oxygen double bond makes it possible to drive the light-emitting element at low voltage more stably.

As the metal complex having a metal-oxygen bond and an aromatic ligand, a phthalocyanine-based material is preferable. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is more likely to act on another molecular in terms of a molecular structure and an acceptor property is high.

Note that as the phthalocyanine-based material described above, a phthalocyanine-based material having a phenoxy group is preferable. Specifically, a phthalocyanine derivative having a phenoxy group, such as PhO-VOPc, is preferable. A phthalocyanine derivative having a phenoxy group is soluble in a solvent; thus, the phthalocyanine derivative has an advantage of being easily handled during formation of a light-emitting element and an advantage of facilitating maintenance of an apparatus used for film formation.

The electron relay layer 707 may further contain a donor substance. Examples of the donor substance include organic compounds such as tetrathianaphthacene (abbreviation: TTN), nickelocene, and decamethylnickelocene, in addition to an alkali metal, an alkaline earth metal, a rare earth metal, and compounds of the above metals (e.g., alkali metal compounds (including an oxide such as lithium oxide, a halide, and carbonates such as lithium carbonate and cesium carbonate), alkaline earth metal compounds (including an oxide, a halide, and a carbonate), and rare earth metal compounds (including an oxide, a halide, and a carbonate)). When such a donor substance is contained in the electron relay layer 707, electrons can be transferred easily and the light-emitting element can be driven at lower voltage.

In the case where a donor substance is contained in the electron relay layer 707, other than the materials described above as the substance having a high electron transport property, a substance having a LUMO level greater than the acceptor level of the acceptor substance contained in the composite material layer 708 may be used. As a specific energy level of the substance having a LUMO level, a LUMO level is greater than or equal to −5.0 eV, preferably greater than or equal to −5.0 eV and less than or equal to −3.0 eV. As examples of such a substance, a perylene derivative and a nitrogen-containing condensed aromatic compound can be given. Note that a nitrogen-containing condensed aromatic compound is preferably used for the electron relay layer 707 because of its stability. Among the nitrogen-containing condensed aromatic compounds, a structure in which a compound having an electron-withdrawing group such as a cyano group or a fluoro group is used is a preferable structure because electrons are easily accepted.

As specific examples of the perylene derivative, the following can be given: 3,4,9,10-perylenetetracarboxylicdianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), and N,N'-dihexyl-3,4,9,10-perylenetetracarboxylic diimide (abbreviation: Hex PTC).

As specific examples of the nitrogen-containing condensed aromatic compound, the following can be given: pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), and 2,3-bis(4-fluorophenyl)pyrido[2,3-b]pyrazine (abbreviation: F2PYPR).

Other examples are 7,7,8,8-tetracyanoquinodimethane (abbreviation: TCNQ), 1,4,5,8-naphthalenetetracarboxylic-dianhydride (abbreviation: NTCDA), perfluoropentacene, copper hexadecafluoro phthalocyanine (abbreviation: F$_{16}$CuPc), N,N'-bis(2,2,3,3,4,4,5,5,6,6,7,7,8,8,8-pentadecafluorooctyl)-1,4,5,8-naphthalenetetracarboxylic diimide (abbreviation: NTCDI-C8F), 3',4'-dibutyl-5,5''-bis(dicyanomethylene)-5,5''-dihydro-2,2':5',2''-terthiophen (abbreviation: DCMT), and methanofullerene (e.g., [6,6]-phenyl C$_{61}$ butyric acid methyl ester).

Note that in the case where a donor substance is contained in the electron relay layer 707, the electron relay layer 707 may be formed by a method such as co-evaporation of the substance having a high electron transport property and the donor substance.

The hole injection layer 701, the hole transport layer 702, the light-emitting layer 703, and the electron transport layer 704 may each be formed using any of the above materials.

This embodiment can be combined with any of the other embodiments disclosed in this specification as appropriate.

(Embodiment 4)

Figure 11:
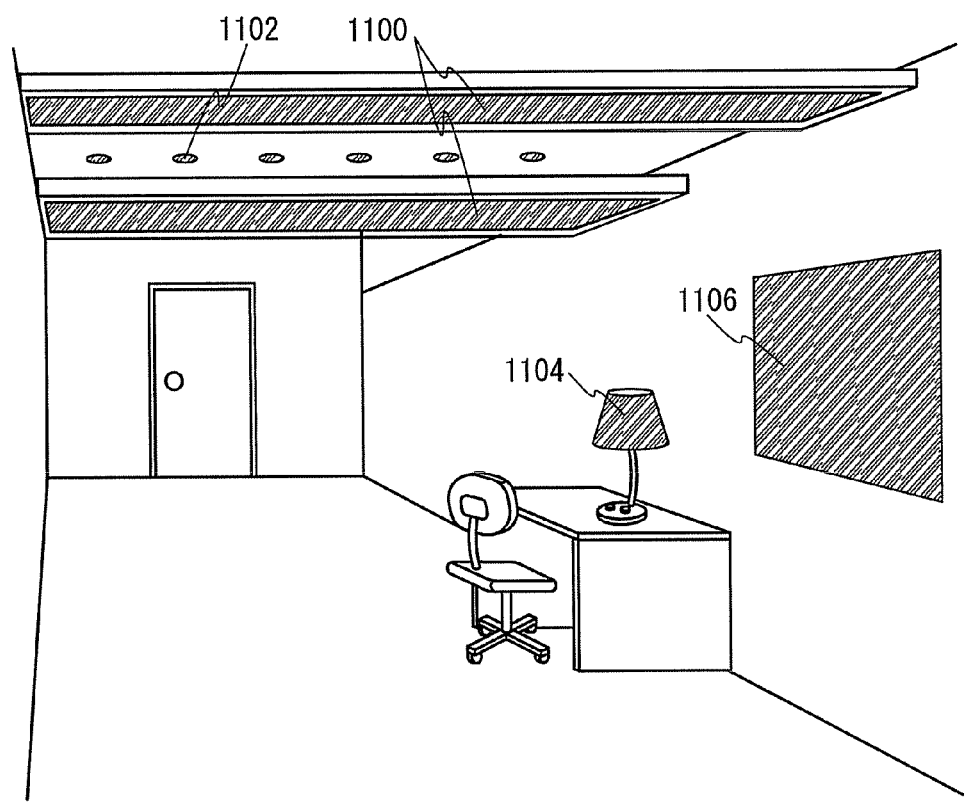
FIG. 11 illustrates lighting devices and an electronic device each including a light-emitting device according to the present invention.

The light-emitting devices disclosed in this specification can be applied to lighting devices or electronic devices. For example, when attached to a ceiling or a wall, the light-emitting devices disclosed in this specification can be used as a lighting device 1100 and a lighting device 1102 as illustrated in FIG. 11. Note that the lighting device 1100 emits light of daylight white so as to illuminate the whole room brightly but naturally, and the lighting device 1102 emits light of incandescent color so as to suppress the brightness of the room and makes a calm atmosphere when the lighting device 1100 is turned off. By the method disclosed in this specification, light-emitting devices with different emission colors can be manufactured easily and inexpensively.

When the light-emitting devices disclosed in this specification are changed in shape, e.g., the light-emitting devices are rolled, light-emitting devices having a variety of shapes can be manufactured; thus, the light-emitting devices can be used for various applications such as a desk lamp 1104.

When attached to a wall or the like, the light-emitting device disclosed in this specification can be used as an electronic poster 1106. In that case, for example, one or a combination of "the light-emitting device which emits light in a mosaic pattern", "the light-emitting device which emits a different color only in a letter portion", and "the light-emitting device which emits light with gradation" which are disclosed in this specification is used, so that the poster becomes highly visible and visual effects can be increased.

This application is based on Japanese Patent Application serial no. 2011-060846 filed with Japan Patent Office on Mar. 18, 2011, the entire contents of which are hereby incorporated by reference.

What is claimed is:

1. A method for manufacturing a light-emitting device comprising the steps of:
   preparing a first substrate;
   forming a first insulating layer over the first substrate;
   forming a first conductive layer capable of transmitting light over the first insulating layer;
   forming a first EL layer over and in electrical contact with the first conductive layer capable of transmitting light;
   preparing a second substrate;
   forming a second insulating layer over the second substrate;
   forming a second conductive layer capable of transmitting light over the second insulating layer;
   forming a second EL layer over and in electrical contact with the second conductive layer capable of transmitting light;
   forming a first conductive layer over the first EL layer; and
   forming a second conductive layer over the second EL layer,
   wherein the second EL layer is formed in a same film formation chamber with a substantially same condition as the first EL layer is formed,
   wherein a thickness of the first conductive layer capable of transmitting light is different from a thickness of the second conductive layer capable of transmitting light, wherein the first conductive layer capable of transmitting light is one of electrodes of a first light-emitting element comprising the first EL layer, and wherein the second conductive layer capable of transmitting light is one of electrodes of a second light-emitting element comprising the second EL layer.

2. The method for manufacturing a light-emitting device, according to claim 1, wherein the second conductive layer capable of transmitting light is formed in a same film formation chamber with a substantially same condition as the first conductive layer capable of transmitting light is formed.

3. The method for manufacturing a light-emitting device, according to claim 1, wherein the first insulating layer and the second insulating layer are formed at the same time.

4. A method for manufacturing a light-emitting device comprising the steps of:
preparing a first substrate;
forming a first insulating layer over the first substrate;
forming a first reflective layer over the first insulating layer;
forming a first conductive layer capable of transmitting light over the first reflective layer;
forming a first EL layer over and in electrical contact with the first conductive layer capable of transmitting light;
preparing a second substrate;
forming a second insulating layer over the second substrate;
forming a second reflective layer over the second insulating layer;
forming a second conductive layer capable of transmitting light over the second reflective layer;
forming a second EL layer over and in electrical contact with the second conductive layer capable of transmitting light;
forming a third conductive layer capable of transmitting light over the first EL layer; and
forming a fourth conductive layer capable of transmitting light over the second EL layer,
wherein the second EL layer is formed in a same film formation chamber with a substantially same condition as the first EL layer is formed,
wherein a thickness of the first conductive layer capable of transmitting light is different from a thickness of the second conductive layer capable of transmitting light,
wherein the first conductive layer capable of transmitting light is one of electrodes of a first light-emitting element comprising the first EL layer, and
wherein the second conductive layer capable of transmitting light is one of electrodes of a second light-emitting element comprising the second EL layer.

5. The method for manufacturing a light-emitting device, according to claim 4, wherein one or both of the first conductive layer capable of transmitting light and the second conductive layer capable of transmitting light are formed to have a light reflectance of greater than or equal to 30% and a light transmittance of greater than or equal to 50% with a wavelength of greater than or equal to 400 nm and less than or equal to 700 nm.

6. The method for manufacturing a light-emitting device, according to claim 4, wherein the second conductive layer capable of transmitting light is formed in a same film formation chamber with a substantially same condition as the first conductive layer capable of transmitting light is formed.

7. The method for manufacturing a light-emitting device, according to claim 4, wherein the first insulating layer and the second insulating layer are formed at the same time.

8. A method for manufacturing a light-emitting device comprising the steps of:
preparing a first substrate;
forming a first insulating layer over the first substrate;
forming a first conductive layer capable of transmitting light over the first insulating layer;
forming a first EL layer over and in electrical contact with the first conductive layer capable of transmitting light;
preparing a second substrate;
forming a second insulating layer over the second substrate;
forming a second conductive layer capable of transmitting light over the second insulating layer;
forming a second EL layer over and in electrical contact with the second conductive layer capable of transmitting light;
forming a first reflective layer having conductivity over the first EL layer; and
forming a second reflective layer having conductivity over the second EL layer,
wherein the second EL layer is formed in a same film formation chamber with a substantially same condition as the first EL layer is formed,
wherein a thickness of the first conductive layer capable of transmitting light is different from a thickness of the second conductive layer capable of transmitting light,
wherein the first substrate and the second substrate are capable of transmitting light,
wherein the first conductive layer capable of transmitting light is one of electrodes of a first light-emitting element comprising the first EL layer, and
wherein the second conductive layer capable of transmitting light is one of electrodes of a second light-emitting element comprising the second EL layer.

9. The method for manufacturing a light-emitting device, according to claim 8, wherein one or both of the first conductive layer capable of transmitting light and the second conductive layer capable of transmitting light are formed to have a light reflectance of greater than or equal to 30% and a light transmittance of greater than or equal to 50% with a wavelength of greater than or equal to 400 nm and less than or equal to 700 nm.

10. The method for manufacturing a light-emitting device, according to claim 8, wherein the second reflective layer is formed in a same film formation chamber with a substantially same condition as the first reflective layer is formed.

11. The method for manufacturing a light-emitting device, according to claim 8, wherein the first insulating layer and the second insulating layer are formed at the same time.

12. A method for manufacturing a light-emitting device comprising the steps of:
preparing a first substrate;
forming a first insulating layer over the first substrate;
forming a reflective layer over the first insulating layer;
forming a first conductive layer capable of transmitting light to partly have a different thickness over the reflective layer;
forming a first EL layer over and in electrical contact with the first conductive layer capable of transmitting light;
preparing a second substrate;
forming a second insulating layer over the second substrate;
forming a second conductive layer capable of transmitting light to partly have a different thickness over the second insulating layer;

forming a second EL layer over and in electrical contact with the second conductive layer capable of transmitting light;

forming a third conductive layer capable of transmitting light over the first EL layer; and forming a fourth conductive layer capable of transmitting light over the second EL layer, wherein the second EL layer is formed in a same film formation chamber with a substantially same condition as the first EL layer is formed, wherein a thickness of the first conductive layer capable of transmitting light is partly different from a thickness of the second conductive layer capable of transmitting light, wherein the first conductive layer capable of transmitting light is one of electrodes of a first light-emitting element comprising the first EL layer, and wherein the second conductive layer capable of transmitting light is one of electrodes of a second light-emitting element comprising the second EL layer.

13. The method for manufacturing a light-emitting device, according to claim 12, wherein one or both of the first conductive layer capable of transmitting light and the second conductive layer capable of transmitting light are formed to have a light reflectance of greater than or equal to 30% and a light transmittance of greater than or equal to 50% with a wavelength of greater than or equal to 400 nm and less than or equal to 700 nm.

14. The method for manufacturing a light-emitting device, according to claim 12, wherein the first insulating layer and the second insulating layer are formed at the same time.

15. A method for manufacturing a light-emitting device comprising the steps of:

preparing a first substrate;

forming a first insulating layer over the first substrate;

forming a first conductive layer capable of transmitting light over the first insulating layer;

forming a first EL layer over and in electrical contact with the first conductive layer capable of transmitting light;

preparing a second substrate;

forming a second insulating layer over the second substrate;

forming a second conductive layer capable of transmitting light over the second insulating layer;

forming a second EL layer over and in electrical contact with the second conductive layer capable of transmitting light;

forming a first reflective layer having conductivity over the first EL layer; and forming a second reflective layer having conductivity over the second EL layer, wherein the second EL layer is formed in a same film formation chamber with a substantially same condition as the first EL layer is formed, wherein a thickness of the first conductive layer capable of transmitting light is partly different from a thickness of the second conductive layer capable of transmitting light, wherein the first substrate and the second substrate have a light-transmitting property, wherein the first conductive layer capable of transmitting light is one of electrodes of a first light-emitting element comprising the first EL layer, and wherein the second conductive layer capable of transmitting light is one of electrodes of a second light-emitting element comprising the second EL layer.

16. The method for manufacturing a light-emitting device, according to claim 15, wherein one or both of the first conductive layer capable of transmitting light and the second conductive layer capable of transmitting light are formed to have a light reflectance of greater than or equal to 30% and a light transmittance of greater than or equal to 50% with a wavelength of greater than or equal to 400 nm and less than or equal to 700 nm.

17. The method for manufacturing a light-emitting device, according to claim 15, wherein the first insulating layer and the second insulating layer are formed at the same time.

* * * * *

UNITED STATES PATENT AND TRADEMARK OFFICE
CERTIFICATE OF CORRECTION

PATENT NO.         : 9,123,912 B2
APPLICATION NO.    : 13/420030
DATED              : September 1, 2015
INVENTOR(S)        : Shunpei Yamazaki and Nobuharu Ohsawa It is certified that error appears in the above-identified patent and that said Letters Patent is hereby corrected as shown below:

In the Specification:

Column 4, Line 64; Change "with, different" to --with different--.

Column 7, Line 32; Change "emission, colors" to --emission colors--.

Column 9, Line 36; Change "direction-indicated" to --direction indicated--.

Column 16, Line 2; Change "to 600, more" to --to 60°, more--.

Column 18, Lines 59 to 60; After "can be provided." add the following new paragraphs "Thus, an interference of light is increased, so that an emission color of the first light-emitting device 140 can be largely changed depending on the length of the first optical path length 142. Further, the same can be said for the second light-emitting device 150.

For example, layers in which an alloy of magnesium and silver (Mg—Ag) with a thickness of 10 nm is formed over the first EL layer 110 and the second EL layer 130 by a resistance heating evaporation method, ITO with a thickness of 50 nm is formed by a mirrortron sputtering method, and then pattern formation treatment is performed as appropriate may be used as the first conductive layer 112 and the second conductive layer 132.

Note that the first conductive layer 112 and the second conductive layer 132 are preferably formed using the same apparatus and condition. Thus, a step of forming the first EL layer 110 and the first conductive layer 112 in this order over the first base substrate 148 and a step of forming the second EL layer 130 and the second conductive layer 132 in this order over the second base substrate 149 can be performed at a time using the same apparatus and condition. Therefore, light emitting devices with different emission colors can be formed more easily.

Next, the first sealant 114 is formed over the first substrate 100 so as to surround the first EL layer 110 and the second sealant 134 is formed over the third substrate 120 so as to surround the Signed and Sealed this
Fifth Day of July, 2016

Michelle K. Lee
*Director of the United States Patent and Trademark Office*

CERTIFICATE OF CORRECTION (continued)
U.S. Pat. No. 9,123,912 B2 second EL layer 130. Then, the second substrate 116 is bonded onto the first substrate 100, and the fourth substrate 136 is bonded onto the third substrate 120 (see FIG. 3C).

The first sealant 114 and the second sealant 134 respectively have functions of suppressing deterioration caused by entry of moisture or oxygen from the outside to the first EL layer 110 and the second EL layer 130, and may be formed by a printing method using any of the following machines: a flexible printing machine, an offset printing machine, a gravure printing machine, a screen printing machine, an inkjet machine, a dispenser, and the like."

Column 21, Line 2; Change "in FIG. 4B; the" to --in FIG. 4B, the--.
Column 21, Lines 15 to 54; after "(in a direction indicated by a white arrow in the drawing),"

delete "Thus, an interference of light is increased, so that an emission color of the first light-emitting device 140 can be largely changed depending on the length of the first optical path length 142. Further, the same can be said for the second light-emitting device 150.

For example, layers in which an alloy of magnesium and silver (Mg—Ag) with a thickness of 10 nm is formed over the first EL layer 110 and the second EL layer 130 by a resistance heating evaporation method, ITO with a thickness of 50 nm is formed by a mirrortron sputtering method, and then pattern formation treatment is performed as appropriate may be used as the first conductive layer 112 and the second conductive layer 132.

Note that the first conductive layer 112 and the second conductive layer 132 are preferably formed using the same apparatus and condition. Thus, a step of forming the first EL layer 110 and the first conductive layer 112 in this order over the first base substrate 148 and a step of forming the second EL layer 130 and the second conductive layer 132 in this order over the second base substrate 149 can be performed at a time using the same apparatus and condition. Therefore, light emitting devices with different emission colors can be formed more easily.

Next, the first sealant 114 is formed over the first substrate 100 so as to surround the first EL layer 110 and the second sealant 134 is formed over the third substrate 120 so as to surround the second EL layer 130. Then, the second substrate 116 is bonded onto the first substrate 100, and the fourth substrate 136 is bonded onto the third substrate 120 (see FIG. 3C).

The first sealant 114 and the second sealant 134 respectively have functions of suppressing deterioration caused by entry of moisture or oxygen from the outside to the first EL layer 110 and the second EL layer 130, and may be formed by a printing method using any of the following machines: a flexible printing machine, an offset printing machine, a gravure printing machine, a screen printing machine, an inkjet machine, a dispenser, and the like."

Column 26, Line 6; Change "N-phenylamino]" to --N'-phenylamino]--.
Column 28, Line 4; Change "N,N-diphenylstilbene" to --N,N'-diphenylstilbene--.

CERTIFICATE OF CORRECTION (continued)
U.S. Pat. No. 9,123,912 B2

Column 29, Line 10; Change "europium(I)" to --europium(III)--.

Column 29, Line 63; Change "(or c-NPD)," to --(or α-NPD),--.

Column 30, Line 46; Change "$10^6$ cm$^2$" to --$10^{-6}$ cm$^2$--.